US012464925B2

United States Patent
Youn et al.

(10) Patent No.: US 12,464,925 B2
(45) Date of Patent: Nov. 4, 2025

(54) DISPLAY DEVICE INCLUDING PROTECTIVE LAYER THAT REDUCES STEP HEIGHT FOR FILLING LAYER

(71) Applicant: Samsung Display Co., Ltd., Yongin-si (KR)

(72) Inventors: Dokyung Youn, Suwon-si (KR); Keunchan Oh, Hwaseong-si (KR); Sun-Kyu Joo, Suwon-si (KR); Min-Jae Kim, Suwon-si (KR); Jae Cheol Park, Hwaseong-si (KR); Chang-Hun Lee, Hwaseong-si (KR); Woo-Man Ji, Anyang-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 456 days.

(21) Appl. No.: 17/946,645

(22) Filed: Sep. 16, 2022

(65) Prior Publication Data

US 2023/0189610 A1 Jun. 15, 2023

(30) Foreign Application Priority Data

Dec. 14, 2021 (KR) .......................... 10-2021-0178514

(51) Int. Cl.
*H10K 59/38* (2023.01)
*H10K 59/122* (2023.01)

(52) U.S. Cl.
CPC ........... *H10K 59/38* (2023.02); *H10K 59/122* (2023.02)

(58) Field of Classification Search
CPC .... H10K 59/38; H10K 59/122; H10K 50/841; H10K 59/12
See application file for complete search history.

(56) References Cited

U.S. PATENT DOCUMENTS

| 7,751,019 | B2 | 7/2010 | Cho et al. | |
|---|---|---|---|---|
| 11,069,751 | B2 | 7/2021 | Kim et al. | |
| 11,489,021 | B2 | 11/2022 | Cho et al. | |
| 11,910,685 | B2 | 2/2024 | Lee | |
| 2012/0200820 | A1* | 8/2012 | Sato | G02F 1/133514 257/E33.053 |
| 2017/0331072 | A1* | 11/2017 | Jo | H10K 71/00 |
| 2019/0025634 | A1* | 1/2019 | Park | G02F 1/133377 |
| 2019/0121176 | A1* | 4/2019 | Lee | H10K 59/879 |
| 2021/0028327 | A1* | 1/2021 | Lin | H01L 25/0753 |

(Continued)

FOREIGN PATENT DOCUMENTS

| KR | 10-1188602 | 10/2012 |
|---|---|---|
| KR | 1020200050517 A | 5/2020 |

(Continued)

*Primary Examiner* — Nduka E Ojeh
(74) *Attorney, Agent, or Firm* — CANTOR COLBURN LLP

(57) ABSTRACT

A display device includes a lower panel including a display element layer and an encapsulation layer disposed on the display element layer, an upper panel including a partition pattern including a first opening and a second opening, and a light control layer including a light control part disposed in the first opening, a protective layer disposed between the upper panel and the lower panel to overlap at least one of the first opening or the second opening and the partition pattern in a plan view, and a filling layer disposed between the protective layer and the lower panel.

27 Claims, 21 Drawing Sheets

(56) References Cited

U.S. PATENT DOCUMENTS

2021/0193742 A1 6/2021 Kim et al.
2023/0387156 A1* 11/2023 Kataoka ................... G02B 5/22

FOREIGN PATENT DOCUMENTS

| KR | 1020200110581 A | 9/2020 |
| KR | 10-2021-0078613 | 6/2021 |
| KR | 1020210142038 A | 11/2021 |

* cited by examiner

DISPLAY DEVICE INCLUDING PROTECTIVE LAYER THAT REDUCES STEP HEIGHT FOR FILLING LAYER

CROSS-REFERENCE TO RELATED APPLICATION(S)

This application claims priority to and benefits of Korean Patent Application No. 10-2021-0178514 under 35 U.S.C. § 119, filed on Dec. 14, 2021 in the Korean Intellectual Property Office, the entire contents of which are incorporated herein by reference.

BACKGROUND

1. Technical Field

The disclosure herein relates to a display device, and, to a display device including a protective layer to improve durability.

2. Description of the Related Art

A display device may be manufactured with an organic electroluminescent material or a quantum dot light emitting material. Such a light emitting material is vulnerable to external environments such as oxygen and moisture and thus requires functional layers to protect the light emitting material.

Foreign substances may be introduced into the display device during a process of manufacturing the display device, in which the functional layers are formed, or members of the display device are provided to be bonded to each other, and thus, the light emitting material may be exposed to the external environment by cracks caused by the introduced foreign substances. In the manufacturing of the display device, in case that upper and lower panels are bonded to each other, a filling layer may not be uniformly disposed due to the deepening in height difference between the bonding surfaces.

The display device may be deteriorated in display quality and durability due to the limitations during the manufacturing process. To prevent the quality deterioration, it is necessary to develop a technology to prevent the foreign substances from being introduced or to prevent the display quality from being deteriorated even in case that the foreign substances are introduced.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device which is maintained in display quality and durability even in case that foreign substances are contained therein.

The disclosure also provides a display device, in which non-coating defects of a filling layer, which may be caused by a bank well structure introduced to improve ink application errors, are prevented in order to improve display quality.

A display device may include a lower panel including a display element layer and an encapsulation layer disposed on the display element layer; an upper panel including a partition pattern including a first opening and a second opening, and a light control layer including a light control part disposed in the first opening; a protective layer disposed between the upper panel and the lower panel, and overlaps at least one of the first opening or the second opening and the partition pattern in a plan view; and a filling layer disposed between the protective layer and the lower panel.

In an embodiment, the filling layer may be directly disposed on the encapsulation layer, and the protective layer may be directly disposed on the filling layer.

In an embodiment, the protective layer may be filled into the first opening and the second opening of the partition pattern.

In an embodiment, the protective layer may be a single layer that covers the partition pattern and the light control layer.

In an embodiment, the second opening may not include the light control part, the protective layer may overlap the partition pattern and the second opening in the plan view and may not overlap the first opening in the plan view, and the protective layer fills the second opening of the partition pattern.

In an embodiment, the first opening may be filled with the filling layer.

In an embodiment, the protective layer may overlap the partition pattern and the first opening in the plan view and may not overlap the second opening in the plan view, and the protective layer may be filled between the light control layer and the filling layer in the first opening of the protective pattern.

In an embodiment, the second opening may not include the light control part, and the second opening may be filled with the filling layer.

In an embodiment, the protective layer may be made of a protective layer resin including an acrylic-based resin or an epoxy-based resin.

In an embodiment, the light control layer may include a barrier layer disposed on at least one of an upper portion and a lower portion of the light control part.

In an embodiment, the barrier layer may include a first barrier layer adjacent to the protective layer and a second barrier layer spaced apart from the protective layer with the light control part disposed between the first barrier layer and the second barrier layer, and the first barrier layer may cover a stepped portion between the partition pattern and the light control part.

In an embodiment, the display element layer may include a pixel defining layer including an emission opening; and a light emitting element including a first electrode including a top surface exposed through the emission opening, a second electrode that faces the first electrode, and a light emitting layer disposed between the first electrode and the second electrode, and the emission opening may overlap the first opening in the plan view.

In an embodiment, the display element layer may include a light emitting element that emits blue light, and the light control layer may include a first light control part including a first quantum dot that converts the blue light into red light; a second light control part including a second quantum dot that converts the blue light into green light; and a third light control part that transmits the blue light.

In an embodiment, the upper panel may include a color filter layer disposed on the light control layer and a base substrate disposed on the color filter layer.

In an embodiment, the color filter layer may include a first filter that transmits the red light and is disposed on the first light control part; a second filter that transmits the green light and is disposed on the second light control part; and a third filter that transmits the blue light.

A display device may include a display area and a non-display area adjacent to the display area; a lower panel including a display element layer including an emission area; an upper panel disposed on the lower panel and including a partition pattern, the partition pattern may include a first opening overlapping the emission area in a plan view and a second opening not overlapping the emission area in the plan view, and a light control layer including a light control part disposed in the first opening; a protective layer disposed between the upper panel and the lower panel, and the protective layer overlaps the display area in the plan view; and a filling layer disposed between the protective layer and the lower panel, wherein the protective layer overlaps at least one of the first opening and the second opening and the partition pattern in the plan view.

In an embodiment, the protective layer may be a single layer that covers a curved portion of a surface of the upper panel facing the lower panel.

In an embodiment, the protective layer may overlap the partition pattern and the second opening in the plan view and may not overlap the first opening in the plan view, and the first opening may be filled with the filling layer, and the second opening may be filled with the protective layer.

In an embodiment, the protective layer may overlap the partition pattern and the first opening in the plan view and may not overlap the second opening in the plan view, and the protective layer may be filled between the light control layer and the filling layer in the first opening of the partition pattern.

In an embodiment, the protective layer may include an outer protective layer overlapping the non-display area in the plan view.

A display device may include a lower panel including an emission area divided by a pixel defining layer; an upper panel disposed on the lower panel and divided into a pixel area and a bank well area divided by a partition pattern; a protective layer disposed between the lower panel and the upper panel, and the protective layer covers a surface of the upper panel facing the lower panel; and a filling layer disposed between the lower panel and the protective layer and the filling layer may include a different material.

In an embodiment, the pixel area may overlap the emission area in the plan view, and the bank well area may not overlap the emission area in the plan view.

In an embodiment, the protective layer may cover a stepped portion between the pixel area and the bank well area.

In an embodiment, the lower panel may include a base layer, a circuit layer disposed on the base layer, a display element layer disposed on the circuit layer, and an encapsulation layer disposed on the display element layer, and the upper panel may include a base substrate, a color filter layer disposed below the base substrate, and a light control layer disposed below the color filter layer.

In an embodiment, the filling layer may be directly disposed on the encapsulation layer, and the protective layer may be disposed between the filling layer and the light control layer.

In an embodiment, the display device may be divided into a display area and a non-display area adjacent to the display area, the display device may include a sealing part disposed between the lower panel and the upper panel corresponding to the non-display area, and the protective layer may be disposed between the sealing part and the upper panel in the non-display area.

In an embodiment, the protective layer may be a single layer overlapping the display area and the non-display area in the plan view.

BRIEF DESCRIPTION OF THE DRAWINGS

The accompanying drawings are included to provide a further understanding of the disclosure, and are incorporated in and constitute a part of this specification. The drawings illustrate embodiments and, together with the description, serve to explain principles of the disclosure. In the drawings.

DETAILED DESCRIPTION OF THE EMBODIMENTS

Figure 1:
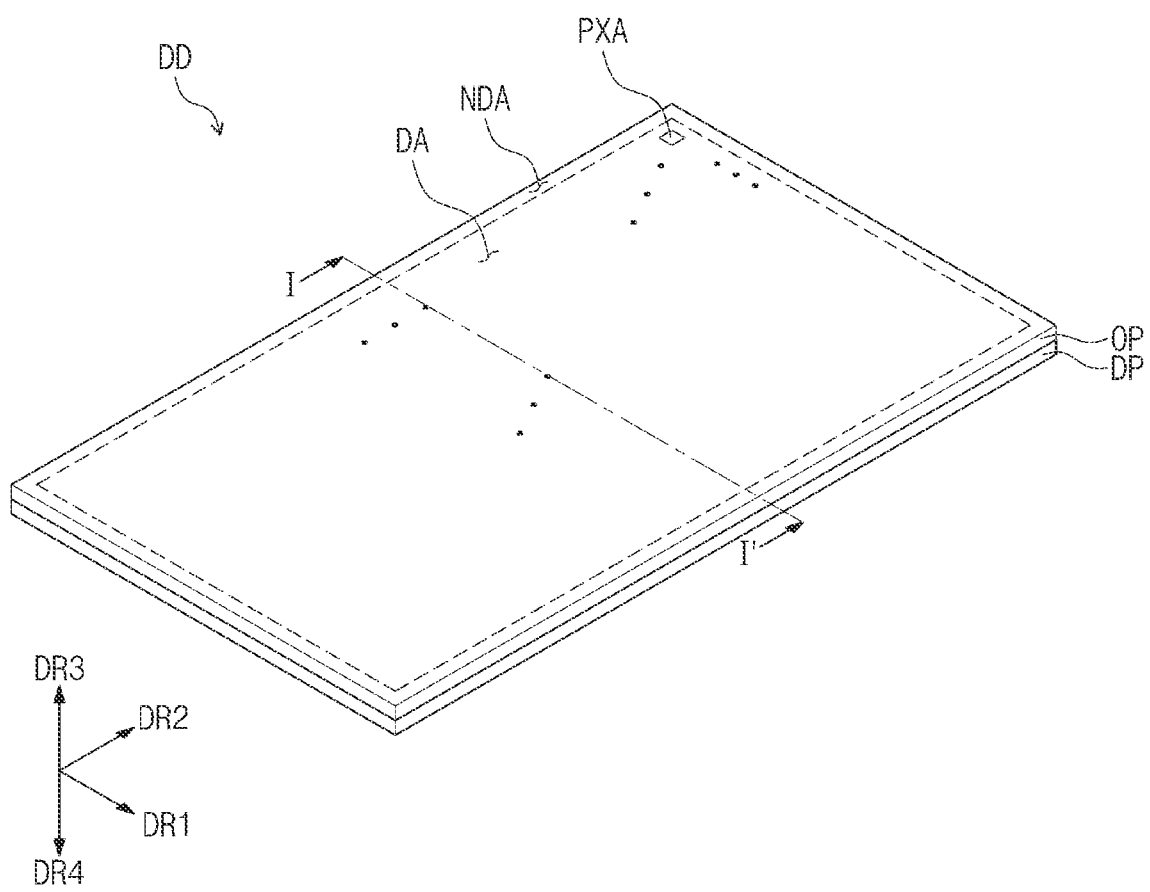
FIG. 1 is a schematic perspective view of a display device according to an embodiment.

Since the disclosure may have diverse modified embodiments, embodiments are illustrated in the drawings and are described in the detailed description of the disclosure. However, the disclosure is not limited within described embodiments and it should be understood that the disclosure covers all the modifications, equivalents, and replacements within the idea and technical scope of the disclosure.

In this specification, it will also be understood that when one component (or area, layer, portion) is referred to as being 'on', 'connected to', or 'coupled to' another component, it can be directly disposed/connected/coupled on/to the one component, or an intervening third component or other component or components may also be present.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

In this specification, "directly disposed" may mean that there is no layer, film, area, plate, or the like between a portion of the layer, the layer, the area, the plate, or the like and the other portion. For example, "directly disposed" may mean being disposed without using an additional member such and an adhesion member between two layers or two members.

Like reference numerals refer to like elements throughout. Also, in the figures, the thickness, ratio, and dimensions of components are exaggerated for clarity of illustration.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that although the terms such as 'first' and 'second' are used herein to describe various elements, these elements should not be limited by these terms. The terms are only used to distinguish one component from other components. For example, a first element referred to as a first element in an embodiment can be referred to as a second element in another embodiment without departing from the scope of the appended claims.

The terms of a singular form may include plural forms unless referred to the contrary. As used herein, the singular forms, "a," "an," and "the" are intended to include the plural forms as well, unless the context clearly indicates otherwise.

Also, ""under", "below", "above', "upper", and the like are used for explaining relation association of the elements illustrated in the drawings. The terms may be a relative concept and described based on directions expressed in the drawings but are not limited thereto. In this specification, the term "disposed on" may refer to a case in which it is disposed on a lower portion as well as an upper portion of any one member.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device according to an embodiment will be described with reference to the accompanying drawings.

Figure 2:
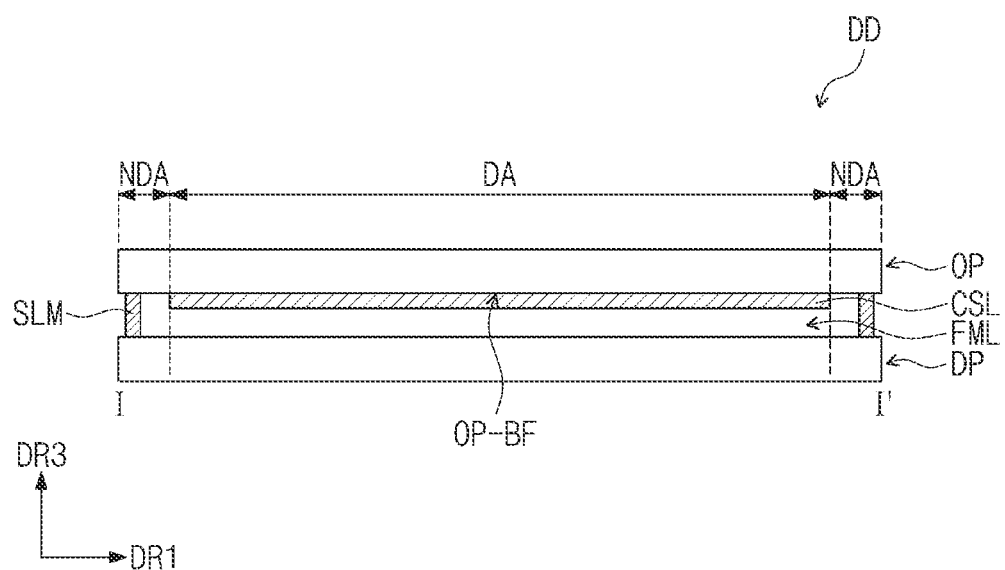
FIG. 2 is a schematic cross-sectional view of the display device according to an embodiment.

FIG. 1 is a schematic perspective view of a display device according to an embodiment. FIG. 2 is a schematic cross-sectional view of the display device according to an embodiment. FIG. 2 is a schematic cross-sectional view schematically illustrating a portion corresponding to the line I-I' of FIG. 1.

A display device DD according to an embodiment may be a device that is activated according to an electrical signal. For example, the display device DD may be a mobile phone, a tablet PC, a car navigation system, a game console, or a wearable device, but the embodiment is not limited thereto.

In FIG. 1 and the following figures, the first to fourth directional axes DR1 to DR4 are illustrated, and directions indicated by the first to fourth directional axes DR1, DR2, DR3, and DR4, which are described in this specification, may be relative concepts and thus may be changed into different directions. Also, directions indicated by the first to fourth direction axes DR1, DR2, DR3, and DR4 may be described as first to fourth directions, and the same reference numerals may be used.

A thickness direction of the display device DD may be a direction parallel to the third directional axis DR3, which is a normal direction to the plane defined by the first directional axis DR1 and the second directional axis DR2. In this specification, a front surface (or top surface) and a rear surface (or bottom surface) of each of members constituting the display device DD may be defined based on the third directional axis DR3.

The display device DD according to an embodiment may include a display area DA and a non-display area NDA adjacent to the display area DA. The display area DA corresponds to a portion at which an image is displayed. Pixel areas PXA may be disposed on the display area DA. The pixel areas PXA may include first to third pixel areas PXA-R, PXA-G, and PXA-B (FIG. 4) that emit light having different wavelength ranges.

In an embodiment, the display area DA may have a rectangular shape. The non-display area NDA may surround the display area DA. However, the embodiment is not limited thereto. For example, the display area DA and the non-display area NDA may be relatively designed in shape. Also, the non-display area NDA may not exist on a display surface that is the front surface of the display device DD. It is to be understood that the shapes disclosed herein may also include shapes substantial to the shapes disclosed herein.

Figure 4:
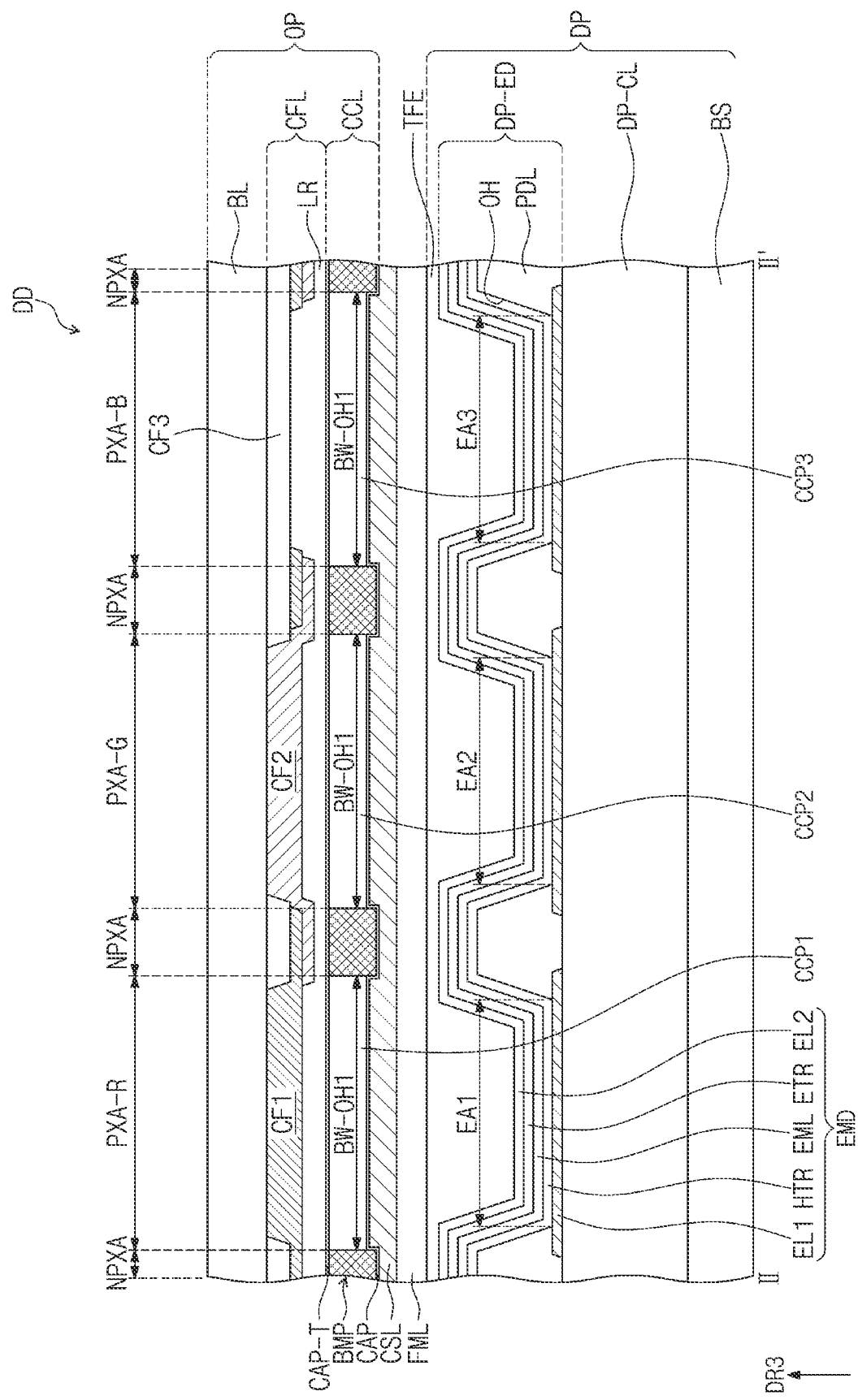
FIG. 4 is a schematic cross-sectional view illustrating a portion of the display device according to an embodiment.

The display device DD according to an embodiment may include a lower panel DP including a display element layer DP-ED (FIG. 4) and an upper panel OP including a light control layer CCL (FIG. 4). In an embodiment, a protective layer CSL and a filling layer FML may be disposed between the lower panel DP and the upper panel OP. In an embodiment, the lower panel DP may be referred to as a display panel or a display substrate, and the upper panel OP may be referred to as a light control panel or a light control substrate.

In an embodiment, the protective layer CSL may be disposed to overlap the display area DA. In an embodiment, the filling layer FML may be filled between the lower panel DP and the protective layer CSL.

The protective layer CSL may be disposed to cover at least a portion of one surface or a surface OP-BF of the upper panel OP, which faces the lower panel DP. For example, the protective layer CSL may be disposed to cover the entire one surface or a surface OP-BF of the upper panel OP. However, the embodiment is not limited thereto, and the protective layer CSL may be disposed only on a selected area of the one surface or a surface OP-BF of the upper panel OP.

The protective layer CSL may function to maintain a gap between the lower panel DP and the upper panel OP. For example, in the display device DD according to an embodiment, the protective layer CSL may function as a column spacer. The display device DD according to an embodiment may include the protective layer CSL disposed between the lower panel DP and the upper panel OP and may not include a confirmation of a separate column spacer.

The protective layer CSL may cover a stepped portion of the one surface or a surface OP-BF of the upper panel. In the display device DD according to an embodiment, the protective layer CSL may planarize a surface on which the filling layer FML is disposed.

In an embodiment, the protective layer CSL may be disposed between the filling layer FML and the upper panel OP to maintain a distance between the lower panel DP and the upper panel OP, thereby preventing the members constituting the upper panel OP or the lower panel DP from being damaged by foreign substances introduced in case that the lower panel DP and the upper panel OP are bonded to each other. In an embodiment, the protective layer CSL may be provided to reduce the stepped portion of the one surface or a surface OP-BF of the upper panel OP so that the filling layer FML is uniformly disposed between the lower panel DP and the upper panel OP. Thus, the display device DD may be improved in display quality and durability.

The protective layer CSL may include a polymer resin. For example, the protective layer CSL may be made of the protective layer resin including an acrylic resin or an epoxy resin. However, the embodiment is not limited thereto, and the protective layer CSL may include various materials within a range in which deformation of light emitted from the pixel area PXA or the like is minimized. For example, the protective layer CSL may be made of a same material or a similar material as the material forming a partition pattern BMP (FIG. 4).

In the display device DD according to an embodiment, the filling layer FML may be filled into a space between the lower panel DP and the upper panel OP. In an embodiment, the filling layer FML may be disposed between the lower panel DP and the protective layer CSL. The filling layer FML may be disposed under or below or directly disposed under or below the protective layer CSL.

The filling layer FML may function as a buffer between the lower panel DP and the upper panel OP. In an embodiment, the filling layer FML may perform a shock absorbing function, etc., and may allow the display device DD to increase in strength. The filling layer FML may be made of a filling resin including a polymer resin. For example, the filling layer FML may be made of a filling layer resin including an acrylic resin or an epoxy resin.

The filling layer FML is distinguished from the protective layer CSL. The filling layer FML and the protective layer CSL may be formed in a separate process, respectively. The filling layer FML and the protective layer CSL may be made of different materials.

The display device DD according to an embodiment may include a sealing part SLM disposed between the lower panel DP and the upper panel OP. The sealing part SLM may couple or connect the lower panel DP to the upper panel OP. The sealing part SLM may be disposed on the non-display area NDA to couple or connect the lower panel DP to the upper panel OP. The sealing part SLM may be disposed on the non-display area NDA, which is an outer portion of the display device DD, to prevent foreign substances, oxygen, and moisture from being introduced into the display device DD from the outside. The sealing part SLM may be made of a sealant including a curable resin. The sealant may include an epoxy resin or an acrylic resin. The sealant may be a thermocurable material or a photocurable material. The sealant may be provided on one surface or a surface of the lower panel DP or the upper panel OP. Thereafter, the lower panel DP and the upper panel OP are bonded to face each other, the sealant may be cured by heat or ultraviolet light to form the sealing part SLM.

Figure 3:
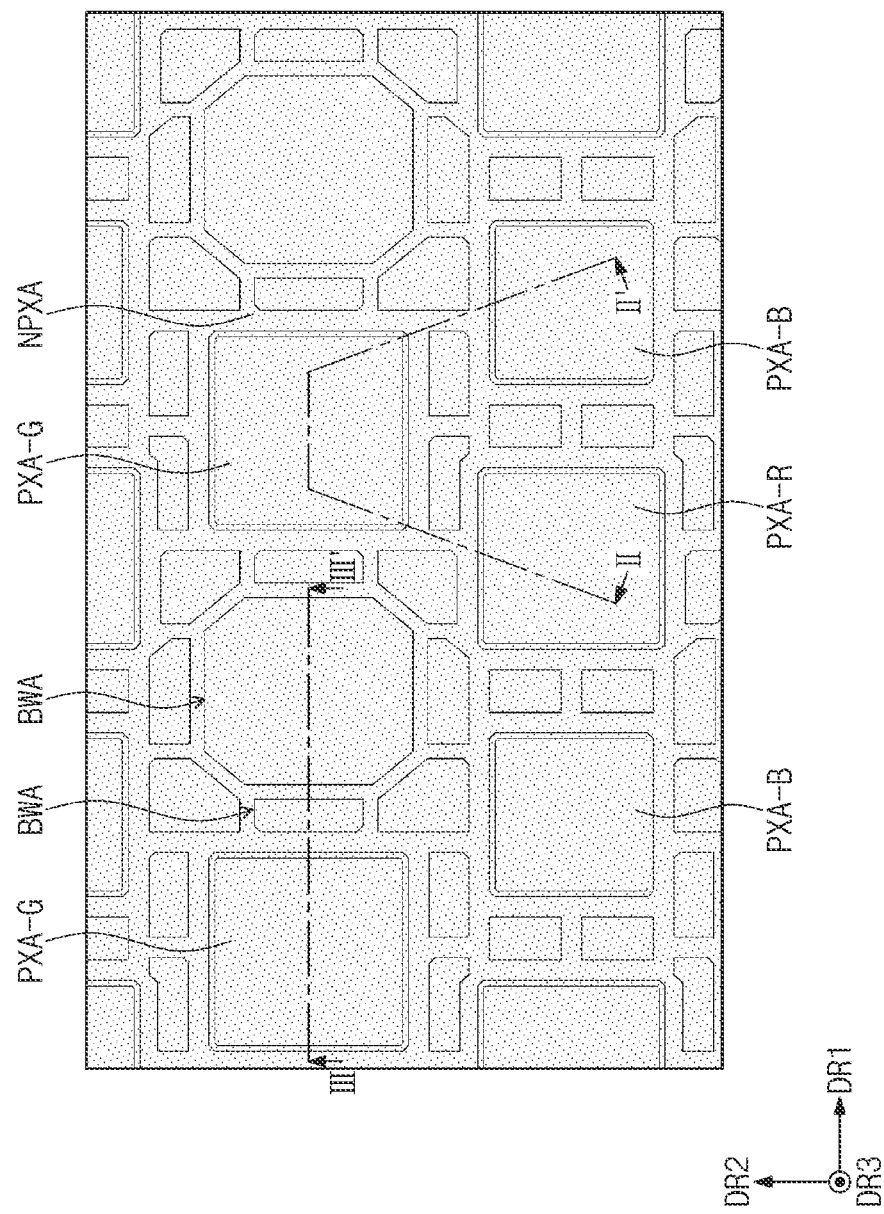
FIG. 3 is a schematic plan view illustrating a portion of the display device according to an embodiment.

FIG. 3 is a schematic plan view illustrating a portion of the display device according to an embodiment. FIG. 4 is a schematic cross-sectional view of the display device according to an embodiment. FIG. 4 is a schematic cross-sectional view taken along line II-IF of FIG. 3. FIG. 3 is a schematic plan view illustrating a portion of the display device DD, in which the protective layer CSL is entirely disposed on a bottom surface of the upper panel OP, according to an embodiment.

Referring to FIGS. 3 and 4, the display device DD according to an embodiment may include pixel areas PXA-R, PXA-G, and PXA-B. For example, the display device DD according to an embodiment may include the first pixel area PXA-R, the second pixel area PXA-G, and the third pixel area PXA-B, which are distinguished from each other. In an embodiment, the first pixel area PXA-R may be a red light-emitting area that emits red light, the second pixel area PXA-G may be a green light-emitting area that emits green light, and the third pixel area PXA-B may be a blue emission area that emits blue light.

In an embodiment, the pixel areas PXA-R, PXA-G, and PXA-B may be repeatedly disposed on the entire display area DA (see FIG. 1). The first to third pixel areas PXA-R, PXA-G, and PXA-B may be distinguished from each other so as not to overlap each other in case that viewed in a plan view. A peripheral area NPXA is disposed around the first to third pixel areas PXA-R, PXA-G, and PXA-B. The peripheral area NPXA sets boundaries between the first to third pixel areas PXA-R, PXA-G, and PXA-B. The peripheral area NPXA may surround the first to third pixel areas PXA-R, PXA-G, and PXA-B. A structure that prevents color mixing between the first to third pixel areas PXA-R, PXA-G, and PXA-B, for example, a pixel defining layer PDL or a partition pattern BMP, etc. may be disposed on the peripheral area NPXA.

FIG. 3 illustrates the display device DD including the first to third pixel areas PXA-R, PXA-G, and PXA-B having a same planar shape and different planar areas, but the embodiment is not limited thereto. All of the first to third pixel areas PXA-R, PXA-G, and PXA-B may have a same surface area, or at least one pixel area may have a different surface area from other pixel areas. The surface areas of the first to third pixel areas PXA-R, PXA-G, and PXA-B may be set according to the light emitting colors.

Referring to FIG. 3, each of the first to third pixel areas PXA-R, PXA-G, and PXA-B may have a rectangular shape on the plane. However, the embodiment is not limited thereto, and each of the first to third pixel areas PXA-R, PXA-G, and PXA-B may have a different polygonal shape (including a substantially polygonal shape) such as a rhombus shape or a pentagonal shape on the plane. Each of the first to third pixel areas PXA-R, PXA-G, and PXA-B may have a rectangular shape (a substantially rectangular shape) with rounded corners on the plane.

In FIG. 3, the second pixel area PXA-G is disposed in a first row, and the first pixel area PXA-R and the third pixel area PXA-B are disposed in a second row. However, the embodiment is not limited thereto, the arrangement of the first to third pixel areas PXA-R, PXA-G, and PXA-B may be variously changed. For example, the first to third pixel areas PXA-R, PXA-G, and PXA-B may be disposed on a same row.

The pixel areas PXA-R, PXA-G, and PXA-B may be aligned or arranged or disposed in a stripe shape, have a PENTILE™ arrangement, or have a Diamond Pixel® arrangement. However, the embodiment is not limited thereto, and the arrangement order and arrangement shape of the pixel areas PXA-R, PXA-G, and PXA-B may be provided to be variously combined depending on characteristics of display quality required in the display device DD.

The display device DD according to an embodiment may include a bank well area BWA. The bank well area BWA may be disposed between the pixel areas PXA-R, PXA-G, and PXA-B. In case that viewed in a plan view, the bank well area BWA may not overlap the pixel areas PXA-R, PXA-G, and PXA-B. The bank well area BWA and the pixel areas PXA-R, PXA-G, and PXA-B may be divided by the partition pattern BMP.

The bank well area BWA may be a portion corresponding to a second opening BW-OH2 (see FIG. 6) defined between the partition patterns BMP so as to prevent defects due to ink application errors used in the process of patterning light control parts CCP1, CCP2, and CCP3 from occurring. Among the inks provided for forming the light control parts CCP1, CCP2, and CCP3, some part of the ink, which is incorrectly applied, may be disposed in the bank well area BWA to improve the bonding defects due to the ink application errors. For example, although not shown in this specification, a portion of an ink composition for forming the light control parts CCP1, CCP2, and CCP3 may be disposed on at least a portion of the bank well area BWA.

The bank well area BWA may be defined to be adjacent to the pixel areas PXA-R, PXA-G, and PXA-B. The planar shape, number, and arrangement of the bank well areas BWA are not limited to those illustrated in FIG. 3 and may be variously changed.

Referring to FIG. 4, in an embodiment, the lower panel DP may include a base layer BS, a circuit layer DP-CL disposed on the base layer BS, and a display element layer DP-ED disposed on the circuit layer DP-CL. Also, the lower panel DP may include an encapsulation layer TFE disposed on the display element layer DP-ED. The display element layer DP-ED may include a pixel defining layer PDL and a light emitting element EMD. The encapsulation layer TFE may cover an upper portion of the display element layer DP-ED. The encapsulation layer TFE may be filled between the display element layer DP-ED and the filling layer FML.

In the display device DD according to an embodiment, the lower panel DP may be an emissive display panel. In an embodiment, the lower panel DP may be an organic electroluminescence display panel. In case that the lower panel DP is an organic electroluminescence display panel, the display element layer DP-ED may include an organic electroluminescence element as the light emitting element EMD. However, the embodiment is not limited thereto. For example, the display element layer DP-ED may include a quantum dot light emitting diode as the light emitting element EMD. The display element layer DP-ED may include a micro LED element and/or a nano LED element as the light emitting element EMD.

In the lower panel DP, the base layer BS may be a member that provides a base surface on which the circuit element layer DP-CL is disposed. The base layer BS may include a glass substrate, a metal substrate, a polymer substrate, and the like within the spirit and the scope of the disclosure. However, the embodiment is not limited thereto. For example, the base layer BS may be an inorganic layer, a functional layer, or a composite layer.

The base layer BS may have a multi-layered structure. For example, the base layer BS may have a three-layered structure constituted by a polymer resin layer, an adhesive layer, and a polymer resin layer. For example, the polymer resin layer may include a polyimide-based resin. Also, the polymer resin layer may include at least one of an acrylate-based resin, a methacrylate-based resin, a polyisoprene-based resin, a vinyl-based resin, an epoxy-based resin, an urethane-based resin, a cellulose-based resin, a siloxane-based resin, a polyamide-based resin, or a perylene-based resin. In this specification, the "~~based" resin means as including a functional group of "~~".

The circuit layer DP-CL may be disposed on the base layer BS. The circuit layer DP-CL may include an insulating layer, a semiconductor pattern, a conductive pattern, and a signal line. The insulating layer, the semiconductor layer, and the conductive layer may be disposed on the base layer BS in a manner such as coating or deposition, and, the insulating layer, the semiconductor layer, and the conductive layer may be selectively patterned through photolithography processes. Thereafter, the semiconductor pattern, the conductive pattern, and the signal line included in the circuit layer DP-CL may be provided. In an embodiment, the circuit layer DP-CL may include a transistor, a buffer layer, and insulating layers.

Referring to FIG. 4, the light emitting element EMD according to an embodiment may include a first electrode EL1, a second electrode EL2 facing the first electrode EL1, and a light emitting layer EML disposed the first electrode EL1 and the second electrode EL2. The light emitting layer EML included in the light emitting element EMD may include an organic light emitting material or quantum dots as a light emitting material. The light emitting element EMD may further include a hole control layer HTR and an electron control layer ETR. Although not shown, the light emitting element EMD may further include a capping layer (not shown) disposed on the second electrode EL2.

The pixel defining layer PDL may be disposed on the circuit layer DP-CL and may cover a portion of the first electrode EL1. An emission opening OH is defined in the pixel defining layer PDL. The emission opening OH of the pixel defining layer PDL exposes at least a portion of the first electrode EL1. In this embodiment, emission areas EA1, EA2, and EA3 is defined to correspond to a partial area of the first electrode EL1 exposed by the emission opening OH.

The lower panel DP may include a first emission area EA1, a second emission area EA2, and a third emission area EA3. The first emission area EA1, the second emission area EA2, and the third emission area EA3 may be areas divided by the pixel defining layer PDL. The first emission area EA1, the second emission area EA2, and the third emission area EA3 may correspond to the first pixel area PXA-R, the second pixel area PXA-G, and the third pixel PXA-B, respectively. In this specification, the "correspondence" means that two components overlap each other in case that viewed in the thickness direction DR3 of the display panel DP, but is not limited to a same area.

The emission areas EA1, EA2, and EA3 may overlap the pixel areas PXA-R, PXA-G, and PXA-B and may not overlap the bank well area BWA. In a plan view, a surface area of each of the pixel areas PXA-R, PXA-G, and PXA-B divided by the partition pattern BMP may be greater than that of each of the emission areas EA1, EA2, and EA3 divided by the pixel defining layer PDL.

In the light emitting element EMD, the first electrode EL1 is disposed on the circuit layer DP-CL. The first electrode EL1 may be an anode or a cathode. Also, the first electrode EL1 may be a pixel electrode. The first electrode EL1 may be a transmissive electrode, a transflective electrode, or a reflective electrode.

The hole control layer HTR may be disposed between the first electrode EL1 and the light emitting layer EML. The hole control layer HTR may include at least one of a hole injection layer, a hole transport layer, or an electron blocking layer. The hole control layer HTR may be disposed as a common layer to entirely overlap the emission areas EA1, EA2, and EA3 and the pixel defining layer PDL that separates the emission areas EA1, EA2, and EA3 from each other. However, the embodiment is not limited thereto, and the hole control layer HTR may be patterned to be separately disposed to correspond to each of the emission areas EA1, EA2, and EA3.

The light emitting layer EML is disposed on the hole control layer HTR. In an embodiment, the light emitting layer EML may be provided as a common layer to entirely overlap the emission areas EA1, EA2, and EA3 and the pixel defining layer PDL that separates the emission areas EA1, EA2, and EA3 from each other. In an embodiment, the light emitting layer EML may emit blue light. The light emitting layer EML may overlap the hole control layer HTR and the electron control layer ETR as a whole.

However, the embodiment is not limited thereto, and in an embodiment, the light emitting layer EML may be disposed in the emission opening OH. For example, the light emitting layer EML may be separated to correspond to the emission areas EA1, EA2, and EA3 divided by the pixel defining layer PDL. All the light emitting layer EML separated to correspond to the emission areas EA1, EA2, and EA3 may emit blue light or may emit light having different wavelength regions.

The light emitting layer EML may have a single layer structure made of a single material, a single layer structure made of materials different from each other, or a multi-layered structure including layers made of materials different from each other. The light emitting layer EML may include a fluorescent or a phosphorescent material. In the light emitting element according to an embodiment, the light emitting layer EML may include an organic light emitting material, a metal organic complex, or quantum dots as a light emitting material.

The electronic control layer ETR may be disposed between the light emitting layer EML and the second electrode EL2. The electron control layer ETR may include at least one of an electron injection layer, an electron transport layer, and a hole blocking layer. Referring to FIG. 4, the electronic control layer ETR may be disposed as a common layer to entirely overlap the emission areas EA1, EA2, and EA3 and the pixel defining layer PDL that separates the emission areas EA1, EA2, and EA3 from each other. However, the embodiment is not limited thereto, and the electron control layer ETR may be patterned to be separately disposed to correspond to each of the emission areas EA1, EA2, and EA3.

The second electrode EL2 may be disposed on the electron control layer ETR. The second electrode EL2 may be a common electrode. The second electrode EL2 may be a cathode or an anode, but this embodiment is not limited thereto. For example, in case that the first electrode EL1 is the anode, the second electrode EL2 may be the cathode, and in case that the first electrode EL1 is the cathode, the second electrode EL2 may be the anode. The second electrode EL2 may be a transmissive electrode, a transflective electrode, or a reflective electrode.

The encapsulation layer TFE may be disposed on the light emitting element EMD. For example, in an embodiment, the encapsulation layer TFE may be disposed on the second electrode EL2. Also, in case that the light emitting element EMD may include a capping layer (not shown), the encapsulation layer TFE may be disposed on the capping layer (not shown). The encapsulation layer TFE may include at least one organic layer and at least one inorganic layer, and the inorganic layer and the organic layer may be alternately disposed.

Figure 5:
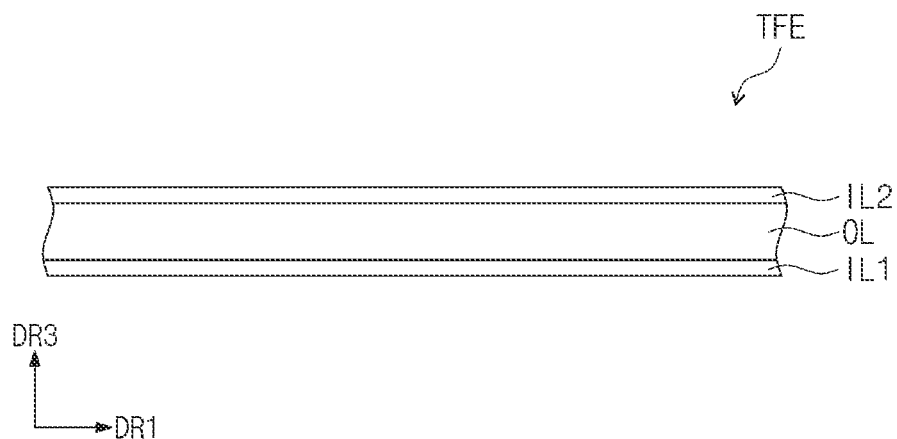
FIG. 5 is a schematic cross-sectional view of an encapsulation layer according to an embodiment.

FIG. 5 is a schematic cross-sectional view of the encapsulation layer according to an embodiment. Referring to FIG. 5, the encapsulation layer TFE may include two inorganic layers IL1 and IL2 and an organic layer OL disposed between the inorganic layers IL1 and IL2. The first inorganic layer ILL the organic layer OL, and the second inorganic layer IL2 may protect the display element layer DP-ED from moisture or oxygen and prevent foreign substances such as dust particles from being introduced.

In the encapsulation layer TFE, each of the first inorganic layer IL1 and the second inorganic layer IL2 may include at least one of silicon nitride, silicon oxynitride, or silicon oxide. For example, in an embodiment, each of the first inorganic layer IL1 and the second inorganic layer IL2 may include titanium oxide or aluminum oxide, but the embodiment is not limited thereto.

In the encapsulation layer TFE, the organic layer OL may be disposed between the first inorganic layer IL1 and the second inorganic layer IL2 and may include an organic polymer material. For example, the organic layer OL may be made of an acrylate-based resin or the like within the spirit and the scope of the disclosure. A thickness of the organic layer OL may be relatively thicker than that of each of the adjacent inorganic layers IL1 and IL2.

FIG. 5 illustrates a structure of the encapsulation layer TFE including one organic layer OL and two inorganic layers IL1 and IL2 disposed with the organic layer OL therebetween, but the embodiment is not limited thereto. For example, the encapsulation layer TFE may include organic layers and inorganic layers, and the inorganic layers and the organic layers may be alternately disposed.

Referring again to FIG. 4, the display device DD according to an embodiment may be disposed on the lower panel DP and may include the upper panel OP including the partition pattern BMP and the light control layer CCL. In an embodiment, the upper panel OP may further include a base substrate BL and a color filter layer CFL.

The color control layer CCL may include a light conversion material. The light conversion material may be a quantum dot or a phosphor. The light conversion material may convert a wavelength of received light to emit light having the converted wavelength. For example, the color control layer CCL may be a layer including the quantum dot or a layer including the phosphor.

The light control layer CCL may include light control parts CCP1, CCP2, and CCP3. The light control parts CCP1, CCP2, and CCP3 may be spaced apart from each other. The light control parts CCP1, CCP2, and CCP3 may be disposed to be spaced apart from each other by the partition pattern BMP. The light control parts CCP1, CCP2, and CCP3 may be disposed in a first opening BW-OH1 defined in the partition pattern BMP. However, the embodiment is not limited thereto. FIG. 4 illustrates that the partition pattern BMP does not overlap the light control parts CCP1, CCP2, and CCP3, but edges of the light control parts CCP1, CCP2, CCP3 may overlap at least a portion of the partition pattern BMP.

Each of the light control parts CCP1, CCP2, and CCP3 may be a portion that converts a wavelength of light provided from the display element layer DP-ED or transmits light provided from the display element layer DP-ED. The light control parts CCP1, CCP2, and CCP3 may be formed by an inkjet process. A liquid ink composition may be provided in the first opening BW-OH1, and the provided ink composition may be polymerized by a thermal curing process or a photocurable process to form the light control parts CCP1, CCP2, and CCP3.

The light control layer CCL may include a first light control part CCP1 including first quantum dots that convert first color light provided from the light emitting element EMD into second color light, and a second light control part CCP2 including second quantum dots that convert the first color light into third color light, and a third light control part CCP3 that transmits the first color light.

In an embodiment, the first light control part CCP1 may provide red light as the second color light, and the second light control part CCP2 may provide green light as the third color light. The third light control part CCP3 may transmit and provide blue light, which is the first color light provided from the light emitting element EMD. For example, the first quantum dots may be red quantum dots, and the second quantum dots may be green quantum dots.

The quantum dots included in the light control layer CCL may have a core-shell structure, and a core of each of the quantum dots may include the Group II-VI compounds, the Group III-VI compounds, the Group compounds, the Group III-V compounds, the Group IV-VI compounds, the Group IV compounds, the Group IV elements, and a combination thereof.

The Group II-VI compounds may be selected from binary element compounds selected from the group consisting of CdSe, CdTe, CdS, ZnS, ZnSe, ZnTe, ZnO, HgS, HgSe, HgTe, MgSe, MgS, and a combination thereof, ternary element compounds selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, and quaternary element compounds selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group III-VI compounds may include binary compounds such as $In_2S_3$ and $In_2Se_3$; ternary compounds such as $InGaS_3$ and $InGaSe_3$; or any combination thereof.

The Group compounds may be selected from ternary compounds selected from the group consisting of AgInS, $AgInS_2$, CuInS, $CuInS_2$, $AgGaS_2$, $CuGaS_2$, $CuGaO_2$, $AgGaO_2$, $AgAlO_2$ and mixtures thereof or quaternary compounds such as $AgInGaS_2$ and $CuInGaS_2$.

The Group III-V compounds may be selected from binary element compounds selected from the group consisting of GaN, GaP, GaAs, GaSb, AlN, AlP, AlAs, AlSb, InN, InP, InAs, InSb, and a combination thereof, ternary element compounds selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a combination thereof, and quaternary element compounds selected form the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. The Group III-V compounds may further include the Group II metal. For example, InZnP or the like may be selected as the group III-II-V compounds.

The Group IV-VI compounds may be selected from binary element compounds selected from the group consisting of SnS, SnSe, SnTe, PbS, PbSe, PbTe, and a combination thereof, ternary element compounds selected from the group consisting of SnSeS, SnSeTe, SnSTe, PbSeS, PbSeTe, PbSTe, SnPbS, SnPbSe, SnPbTe, and a combination thereof, and quaternary element compounds selected form the group consisting of SnPbSSe, SnPbSeTe, SnPbSTe, and a combination thereof. The Group IV elements may be selected from the group consisting of Si, Ge, and a combination thereof.

The Group IV compounds may be binary element compounds selected from the group consisting of SiC, SiGe, and a combination thereof.

Here, the binary element compounds, the ternary element compounds, and the quaternary element compounds may exist in the particle at a uniform concentration or exist in the particle in a state in which concentration distribution is partitioned into partially different states. By way of example, the quantum dot may have a core-shell structure in which one quantum dot surrounds the other quantum dot. A core-shell structure may have a concentration gradient in which an element existing in the shell has a concentration that gradually decreases toward the core.

In an embodiment, the quantum dot may have a core-shell structure, which may include a core including the above-described nano crystal and a shell surrounding the core. The shell of the quantum dot may serve as a protection layer that prevents the core from being chemically changed to maintain the semiconductor characteristics and/or may serve as a charging layer for imparting electrophoretic characteristics to the quantum dot. The shell may be a single layer or a multi-layer. For example, the shell of the quantum dot may include oxide of a metal or nonmetal, a semiconductor compound, or a combination thereof.

For example, the oxide of the metal or nonmetal may include binary element compounds of $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and the like or ternary element compounds $MgAl_2O_4$, $CoFe_2O_4$, $NiFe_2O_4$, $CoMn_2O_4$, and the like, but the embodiment is not limited thereto.

By way of example, the semiconductor compounds may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but the embodiment is not limited thereto.

The quantum dot may have a full width of half maximum (FWHM) of an emission wavelength spectrum of about 45 nm or less, about 40 nm or less, and about 30 nm or less. In this range, color purity and color reproducibility may be improved. Also, light emitted through the quantum dot may be emitted in all directions to improve an optical viewing angle.

Also, the quantum dot has a shape that may be generally used in the art and is not specifically limited in shape. However, the quantum dot may have a spherical shape, a pyramidal shape, a multi-arm shape, a cubic nanoparticle shape, a nanotube shape, a nanowire shape, a nanofiber shape, a nanoplate particle shape, or the like within the spirit and the scope of the disclosure.

The quantum dot may adjust a color of emitted light according to a size thereof. Thus, the quantum dot may emit light having various colors such as a blue color, a red color, and a green color. As a particle size of each of the quantum dots decreases, light having a short wavelength region may be emitted. For example, a particle size of each of the quantum dots emitting the green light from the quantum dots having a same core may be less than that of each of the quantum dots emitting the red light. A particle size of each of the quantum dots emitting the blue light from the quantum dots having a same core may be less than that of each of the quantum dots emitting the green light. However, the embodiment is not limited thereto, and even in the quantum dots having a same core, the particle size may be adjusted according to the material for forming the shell and the thickness of the shell.

In case that the quantum dots have various light emitting colors such as the blue, red, and green colors, the quantum dots having different light emitting colors may have different core materials.

The light control layer CCL may further include a scatterer. A first light control part CCP1 may include a first quantum dot and a scatterer, a second light control part CCP2 may include a second quantum dot and a scatterer, and a third light control part CCP3 may not include a quantum dot and may include a scatterer.

The scatterers may be inorganic particles. For example, the light scatterer may include at least one of $TiO_2$, ZnO, $Al_2O_3$, $SiO_2$, or hollow silica. The light scatterer may include one of $TiO_2$, ZnO, $Al_2O_3$, $SiO_2$, and hollow silica or may be a mixture of two or more materials selected from $TiO_2$, ZnO, $Al_2O_3$, $SiO_2$, and hollow silica.

Each of the first light control part CCP1, the second light control part CCP2, and the third light control part CCP3 may include a base resin that disperses the quantum dots and the scatterer. In one embodiment, the first light control part CCP1 may include a first quantum dot and a scatterer dispersed in the base resin, the second light control part CCP2 may include a second quantum dot and a scatterer dispersed in the base resin, and the third light control part CCP3 may include a scatterer dispersed in the base resin.

The base resin may be a medium in which the quantum dot and/or the scatterer are dispersed. In general, the base resin may include various resin compositions that are called binders. For example, the base resin may include an acrylic-based resin, a urethane-based resin, and a silicon-based resin, and an epoxy-based resin. The base resin may be a transparent resin.

The light control layer CCL may further include barrier layers CAP and CAP-T disposed on at least one of an upper portion or a lower portion of the light control part. The barrier layer CAP and CAP-T may prevent moisture and/or oxygen (hereinafter, referred to as 'moisture or oxygen') from being permeated. The barrier layers CAP and CAP-T may be disposed above and below the light control parts CCP1, CCP2, and CCP3 to prevent the light control parts CCP1, CCP2, and CCP3 from being exposed to the moisture or oxygen.

The barrier layers may include a first barrier layer CAP adjacent to the protective layer CSL and a second barrier layer CAP-T spaced apart from the protective layer CSL with the light control parts CCP1, CCP2, and CCP3 therebetween. The first barrier layer CAP may cover one surface or a surface of each of the light control parts CCP1, CCP2, and CCP3 adjacent to the lower panel DP, and the second barrier layer CAP-T may cover the other surface of each of the light control parts CCP1, CCP2, and CCP3 adjacent to the color filter layer CFL. Also, the barrier layers CAP and CAP-T may cover the partition pattern BMP as well as the light control parts CCP1, CCP2, and CCP3.

The first barrier layer CAP may be disposed to follow (or may cover) a stepped portion between the partition pattern BMP and each of the light control parts CCP1, CCP2, and CCP3. The second barrier layer CAP-T may cover one surface or a surface of each of the partition pattern BMP adjacent to the color filter layer CFL and the light control parts CCP1, CCP2, and CCP3. The second barrier layer CAP-T may be disposed under or below or directly disposed under or below a low refractive index layer LR.

Each of the barrier layers CAP and CAP-T may include at least one inorganic layer. For example, each of the barrier layers CAP and CAP-T may include an inorganic material. For example, each of the barrier layer CAP and CAP-T may include at least one of silicon nitride, aluminum nitride, zirconium nitride, titanium nitride, hafnium nitride, tantalum nitride, silicon oxide, aluminum oxide, titanium oxide, tin oxide, cesium oxide, silicon oxynitride, or a metal thin film having secured light transmittance. For example, the first barrier layer CAP disposed under or below the light control parts CCP1, CCP2, and CCP3 may include silicon oxynitride, and the second barrier layer CAP-T disposed on the light control parts CCP1, CCP2, and CCP3 may include silicon oxide. However, the embodiment is not limited thereto. Each of the barrier layers CAP and CAP-T may further include an organic layer. Each of the barrier layers CAP and CAP-T may be formed as a single layer or layers.

In the display device DD according to an embodiment, the upper panel OP may include a color filter layer CFL disposed on the light control layer CCL. The color filter layer CFL may include filters CF1, CF2, and CF3. The color filter layer CFL may include a first filter CF1 that transmits the second color light, a second filter CF2 that transmits the third color light, and a third filter CF3 that transmits the first color light. For example, the first filter CF1 may be a red filter, the second filter CF2 may be a green filter, and the third filter CF3 may be a blue filter. Each of the filters CF1, CF2, and CF3 may include a polymer photosensitive resin and a pigment or dye. The first filter CF1 may include a red pigment or dye, the second filter CF2 may include a green pigment or dye, and the third filter CF3 may include a blue pigment or dye. However, the embodiment is not limited thereto. For example, the third filter CF3 may not include the pigment or dye. The third filter CF3 may include the polymeric photosensitive resin and may not include the pigment or dye. The third filter CF3 may be transparent. The third filter CF3 may be made of a transparent photosensitive resin.

Also, in an embodiment, each of the first filter CF1 and the second filter CF2 may be a yellow filter. The first filter CF1 and the second filter CF2 may not be separated from each other, but may be integral with each other. The first to third filters CF1, CF2, and CF3 may be disposed to correspond to the first pixel area PXA-R, the second pixel area PXA-G, and the third pixel area PXA-B, respectively. The first to third filters CF1, CF2, and CF3 may be disposed to correspond to the first to third light control parts CCP1, CCP2, and CCP3, respectively.

The filters CF1, CF2, and CF3 that transmit different color light may overlap each other to correspond to the peripheral area NPXA disposed between the pixel areas PXA-R, PXA-G, and PXA-B. The filters CF1, CF2, and CF3 may overlap each other in the thickness direction of the third direction axis DR3 to define boundaries between the adjacent light emitting regions PXA-R, PXA-G, and PXA-B. Unlike the illustrated configuration, the color filter layer CFL may include a light blocking part (not shown) that defines the boundaries between the adjacent filters CF1, CF2, and CF3. The light blocking part (not shown) may be provided as a blue filter or include an organic light blocking material or an inorganic light blocking material including a black pigment or dye. The color filter layer CFL may include a low refractive index layer LR. The low refractive index layer LR may be disposed between the light control layer CCL and each of the filters CF1, CF2, and CF3. The low refractive index layer LR may be disposed on the light control layer CCL to prevent the light control parts CCP1, CCP2, and CCP3 from being exposed to the moisture or oxygen. The low refractive index layer LR may be disposed between each of the light control parts CCP1, CCP2, CCP3 and the filters CF1, CF2, CF3 to improve light extraction efficiency or may prevent reflected light from being incident into the light control layer CCL to serve as an optical functional layer. The low refractive index layer LR may be a layer having a lower refractive index than that of an adjacent layer.

The low refractive index layer LR may include at least one inorganic layer. For example, the low refractive index layer LR may include at least one of silicon nitride, aluminum nitride, zirconium nitride, titanium nitride, hafnium nitride, tantalum nitride, silicon oxide, aluminum oxide, titanium oxide, tin oxide, cesium oxide, silicon oxynitride, or a metal thin film having secured light transmittance. However, the embodiment is not limited thereto, and the low refractive index layer LR may include an organic layer. For example, the low refractive index layer LR may include a polymer resin and inorganic particles. The low refractive index layer LR may be provided as a single layer or layers.

In the display device DD according to an embodiment, the filters CF1, CF2, and CF3 of the color filter layer CFL may be disposed on or directly disposed on the light control layer CCL. The low refractive index layer LR may be omitted.

In an embodiment, the upper panel OP may further include a base substrate BL disposed on the color filter layer CFL. The base substrate BL may be a member that provides a base surface on which the color filter layer CFL, the light control layer CCL, and the like are disposed. The base substrate BL may be a glass substrate, a metal substrate, or a plastic substrate. However, the embodiment is not limited thereto. For example, the base substrate BL may be an inorganic layer, an organic layer, or a composite layer. Also, unlike the illustrated configuration, in an embodiment, the base substrate BL may be omitted.

The partition pattern BMP may include a material having transmittance less than or equal to a value. The partition pattern BMP may include a black coloring agent to block light. The partition pattern BMP may include a black dye or a black pigment mixed with a base resin. In one embodiment, the black component may include carbon black or may include a metal such as chromium or an oxide thereof.

A first opening BW-OH1 and a second opening BW-OH2 (FIG. 6) may be defined in the partition pattern BMP. The first opening BW-OH1 may correspond to each of the pixel areas PXA-R, PXA-G, and PXA-B, and the second opening BW-OH2 may correspond to the bank well area BWA. The first opening BW-OH1 may overlap the emission opening OH. In a plan view, the first opening BW-OH1 may have an area greater than that of the emission opening OH.

Figure 6:
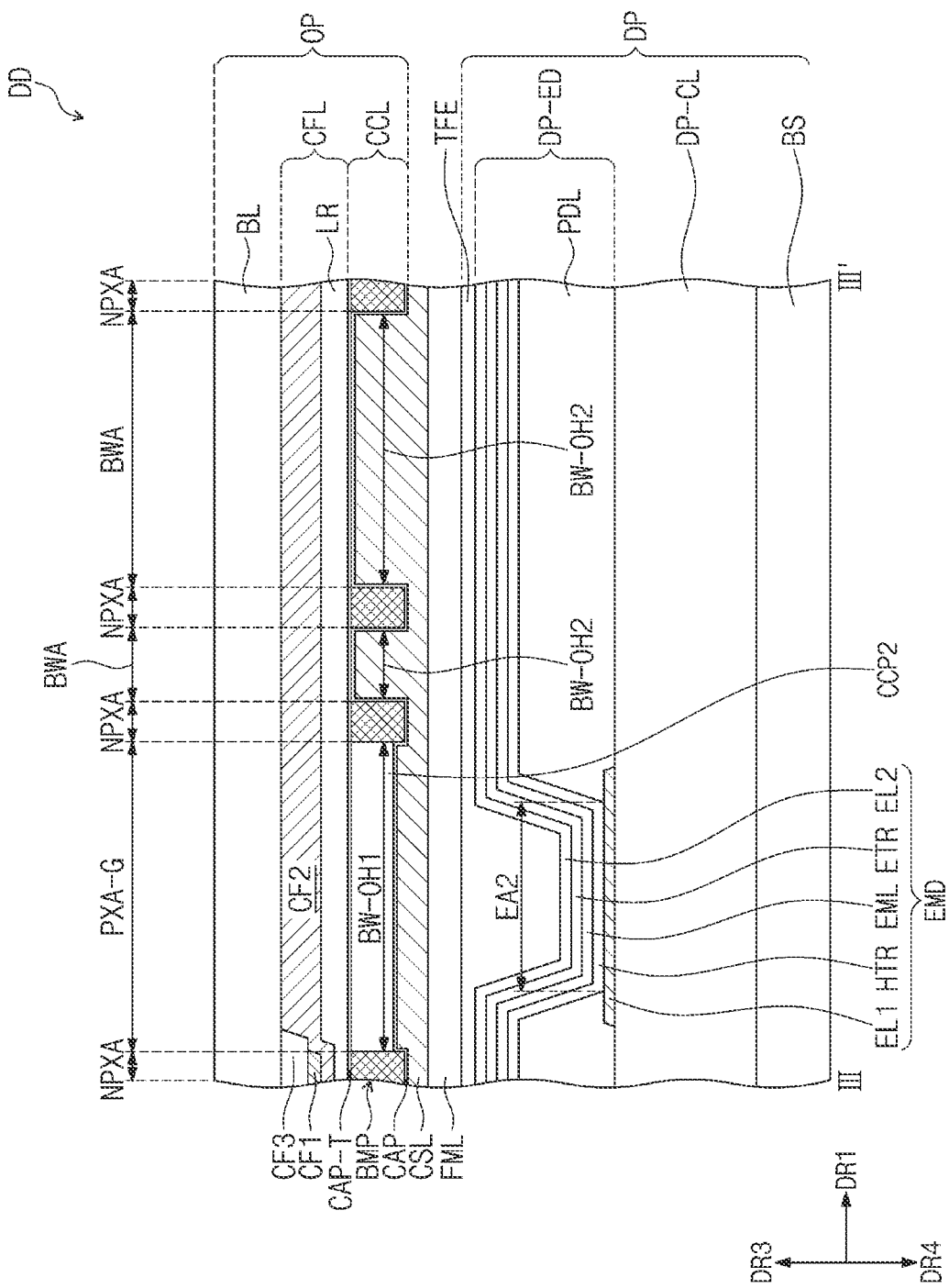
FIG. 6 is a schematic cross-sectional view illustrating a portion of the display device corresponding to line III-III' of FIG. 3 according to an embodiment.
Figure 7:
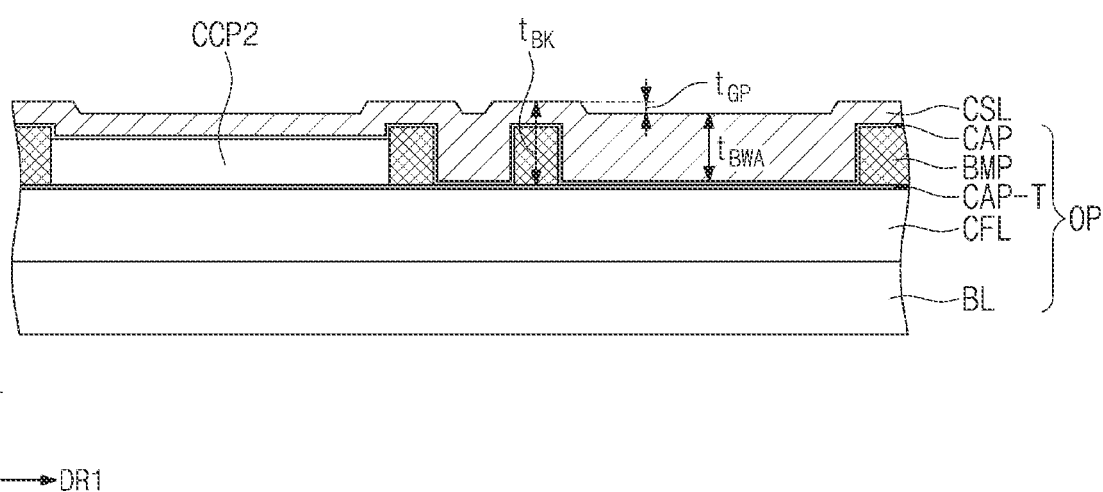
FIG. 7 is a schematic cross-sectional view illustrating a portion of the display device according to an embodiment.

FIG. 6 is a schematic cross-sectional view illustrating a portion of the display device according to an embodiment, and FIG. 7 is a schematic cross-sectional view illustrating a portion of the display device according to an embodiment. FIG. 6 is a schematic cross-sectional view of a portion corresponding to line III-III' of FIG. 3.

Referring to FIGS. 6 and 7, the light control parts CCP1, CCP2, and CCP3 may not be disposed in the second opening BW-OH2 of the partition pattern BMP. The protective layer CSL or the filling layer FML may be filled in the second opening BW-OH2 of the partition pattern BMP. Referring to FIGS. 3 and 6, second openings BW-OH2 in the partition pattern BMP may be defined to have various shapes or different sizes. For example, bank well areas BWA defined by the second opening BW-OH2 may be disposed between the pixel areas PXA-R, PXA-G, and PXA-B.

Referring to FIGS. 6 and 7, in the display device DD according to an embodiment, the protective layer CSL may overlap the partition pattern BMP, the first opening BW-OH1, and the second opening BW-OH2. For example, in an embodiment, the protective layer CSL may cover the partition pattern BMP and the light control layer CCL and may be disposed to be filled into the first opening BW-OH1, in which the light control part CCP2 is disposed, and the second opening BW-OH2, in which the light control part CCP2 is not disposed.

In the display device DD according to an embodiment, the protective layer CSL may be provided as a single layer that covers the partition pattern BMP and the light control layer CCL. For example, in an embodiment, the protective layer CSL may be disposed as one layer or a layer while being filled between the filling layer FML and the light control layer CCL.

On the other hand, although not shown in the drawings, in case that the liquid ink composition is provided by the inkjet process, a portion of the ink composition, which is not seated in the first opening BW-OH1, may be disposed in a portion of the second opening BW-OH2 corresponding to the bank well area BWA. Thus, in the display device DD according to an embodiment, defects due to the incorrect ink application errors may be improved by including the bank well area BWA. In case that a portion of the ink composition that has been incorrectly applied is disposed in the second opening BW-OH2, the protective layer CSL or the filling layer FML may be filled in the remaining portion of the second opening BW-OH2.

Referring to FIGS. 6 and 7, in an embodiment, the protective layer CSL may be disposed to be filled into the second opening BW-OH2, thereby minimizing a stepped portion on one surface or a surface of the upper panel OP. The protective layer CSL may be disposed to cover the light control part CCP2 and the partition pattern BMP and may be filled into the second opening BW-OH2. For example, in an embodiment, the protective layer CSL may be provided to have a thickness $t_{BWA}$ in the second opening BW-OH2, in which the light control part is not disposed, thereby minimizing a difference $t_{GP}$ between the thickness $t_{BK}$ of the portion, at which the partition pattern BMP is disposed, and the thickness of the bank well area BWA. For example, in the second opening BW-OH2, in which the light control part is not disposed, the difference $t_{GP}$ between the thickness $t_{BWA}$ of the portion, at which the protective layer CSL is disposed, and the thickness $t_{BK}$ of the portion, at which the protective layer CSL is disposed on the partition pattern BMP, may be about 2 µm or less. For example, as the protective layer CSL is disposed to be filled into the second opening BW-OH2 and cover the light control layer CCL and the partition pattern BMP, the stepped portion on the one surface or a surface of the upper panel OP may be compensated.

In an embodiment, as the protective layer CSL is provided to be filled into the second opening BW-OH2 and cover the entirety of the light control part CCP2 and the partition pattern BMP, a height difference between the pixel areas PXA-G and the bank well areas BWA may be reduced. Thus, in case that the filling layer FML is provided on the protective layer CSL, the filling layer FML may be uniformly provided on the entirety of the pixel areas PXA-G and the bank well area BWA. In case that the filling layer FML is uniformly provided on the entirety of the pixel areas PXA-G and the bank well area BWA, dents due to the foreign substances introduced in case that the lower panel DP and the upper panel OP are bonded to each other, or cracks due to the dents may be minimized to improve the reliability of the display device DD according to an embodiment.

A thickness of the protective layer CSL disposed on the partition pattern BMP may be about 1 µm or more. For example, the thickness of the protective layer CSL disposed on the partition pattern BMP may be about 1 µm or more and about 3 µm or less, and accordingly, the protective layer CSL disposed on the partition pattern BMP may serve as a column spacer.

Figure 8A:
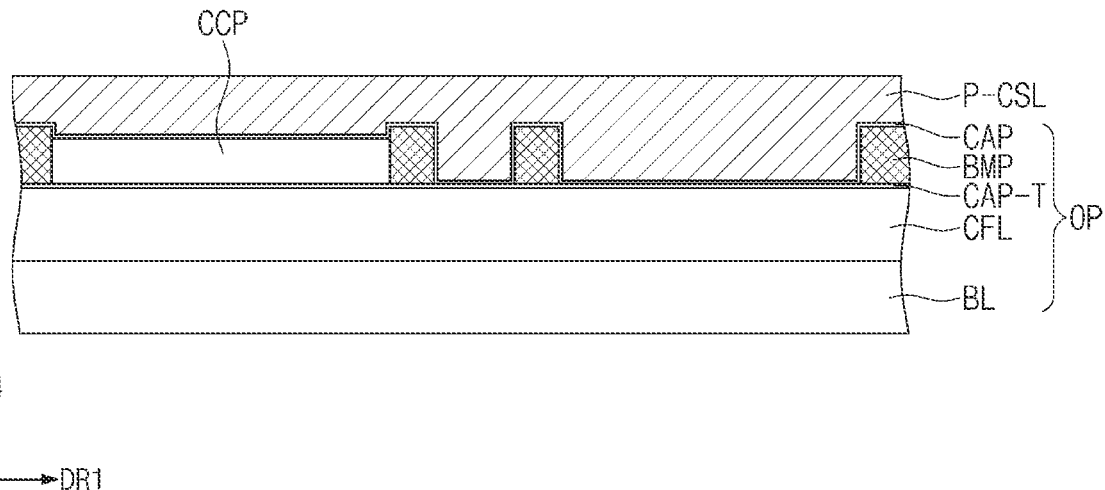
FIGS. 8A to 8C are schematic cross-sectional views sequentially illustrating partial processes of manufacturing the display device according to an embodiment.
Figure 8B:
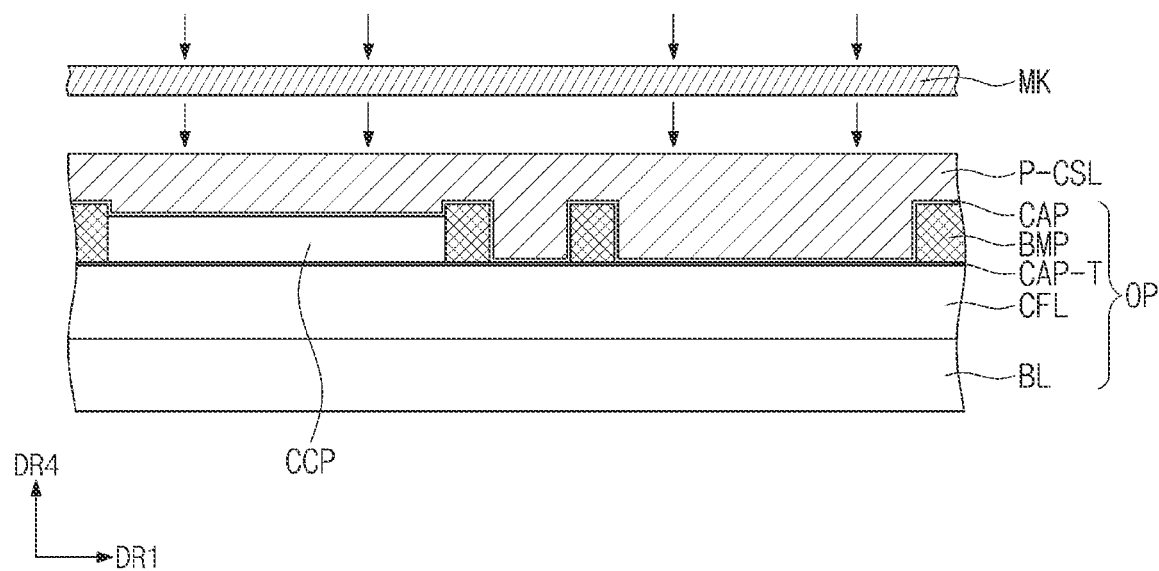
Figure 8C:
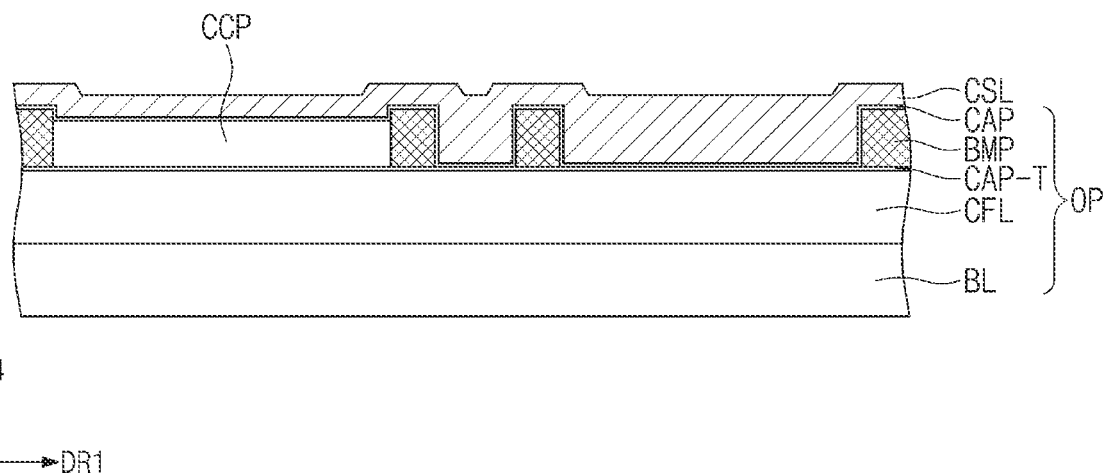

FIGS. 8A to 8C are schematic view illustrating each process of a method for manufacturing the protective layer in the display device according to an embodiment.

FIG. 8A illustrates a process of forming a preliminary protective layer P-CSL, which is a coating layer, by providing a protective layer resin on the upper panel OP. A liquid protective layer resin may be provided on the upper panel OP, on which the light control part CCP, the partition pattern BMP, and the first barrier layer CAP are disposed, to form the preliminary protective layer P-CSL. The preliminary protective layer P-CSL may be disposed while being filled into the opening defined in the partition pattern BMP.

FIG. 8B illustrates an example of a process of curing the preliminary protective layer P-CSL. The preliminary protective layer P-CSL may be cured using an irradiation process or the like within the spirit and the scope of the disclosure. A mask MK may be used, and the preliminary protective layer P-CSL may be cured by light, for example, UV light transmitted through the mask MK. The UV light may be provided only onto a selected area through the mask MK, and accordingly, only the preliminary protective layer P-CSL on the selected area may be cured to form a protective layer CSL.

FIG. 8C illustrates a process of forming the protective layer CSL by performing development and heat treatment processes after curing the preliminary protective layer P-CSL illustrated in FIG. 8B. The protective layer CSL formed by performing the development and heat treatment processes may be formed as one layer or a layer while minimizing the stepped portion of the upper panel OP. Referring to FIG. 8C, the protective layer CSL may be filled into the opening defined in the partition pattern BMP and may be disposed along the shapes of the light control part CCP and the partition pattern BMP.

Figure 9:
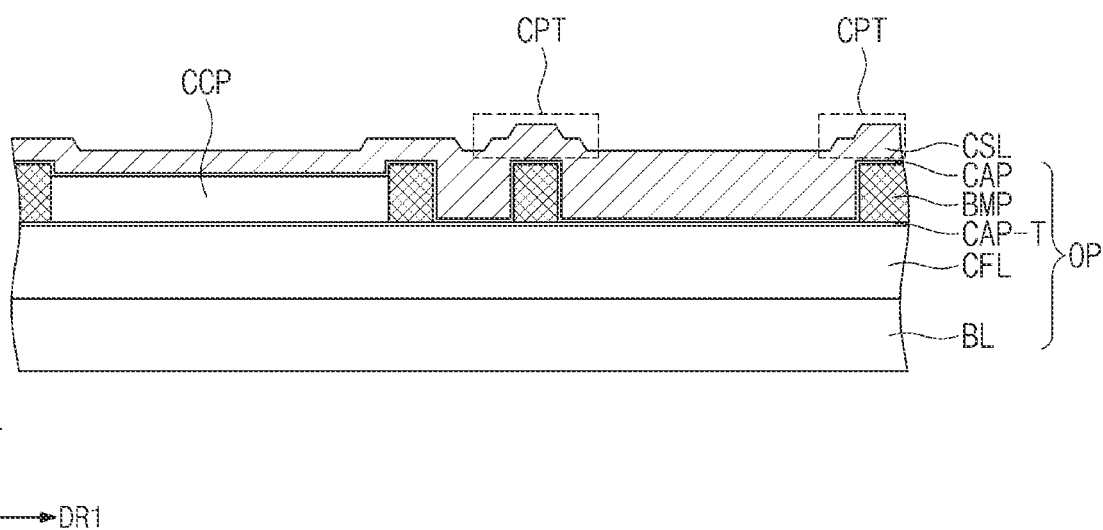
FIG. 9 is a schematic cross-sectional view illustrating a portion of the display device according to an embodiment.

FIG. 9 is a schematic cross-sectional view illustrating a portion of the display device according to an embodiment. Referring to FIG. 9, the protective layer CSL may have a shape of a protrusion pattern CPT protruding in a direction that is away from the partition pattern BMP at a portion overlapping the partition pattern BMP. The protective layer CSL may be manufactured to have a same shape as the protrusion pattern CPT, and the shape of the protrusion pattern CPT may be manufactured using a half-tone mask and the like in the method for manufacturing the display device according to an embodiment illustrated in FIG. 8B and the like within the spirit and the scope of the disclosure.

The display device DD according to an embodiment described with reference to FIGS. 1 to 9 may include a filling layer FML and a protective layer CSL disposed between the lower panel DP and the upper panel OP. The display device DD according to an embodiment may include the protective layer CSL provided to cover a stepped portion of one surface or a surface of the upper panel OP facing the lower panel DP to maintain a spaced distance between the lower panel DP and the upper panel OP, thereby preventing the lower panel DP or the upper panel OP from being damaged by foreign substances introduced between the lower panel DP and the upper panel OP.

Hereinafter, a display device according to an embodiment will be described with reference to FIGS. 10A to 15C. In the description of FIGS. 10A to 15C, content overlapping with those described in FIGS. 1 to 9 will not be described again, and differences will be described.

Figure 10A:
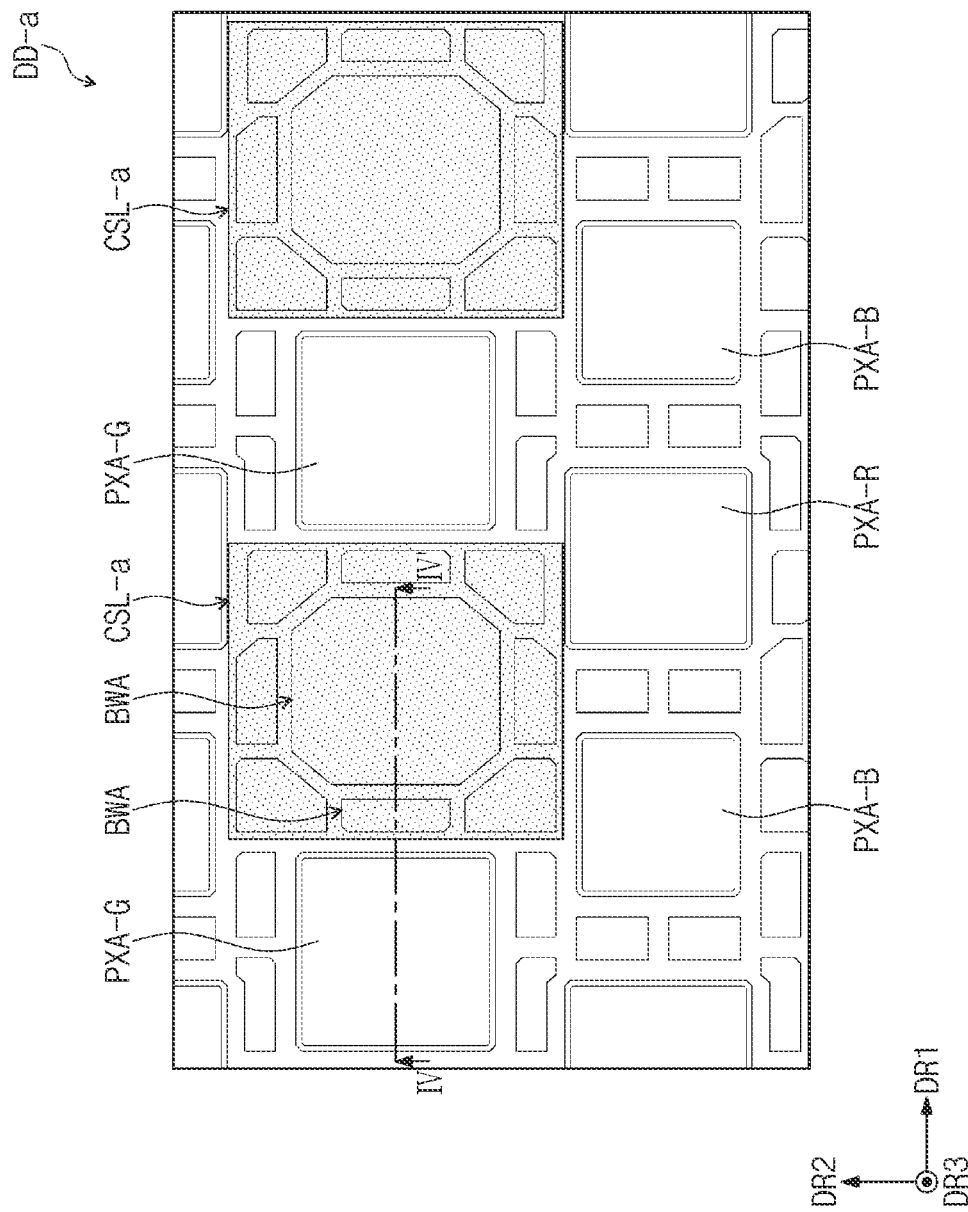
FIG. 10A is a schematic plan view illustrating a portion of the display device according to an embodiment.
Figure 10B:
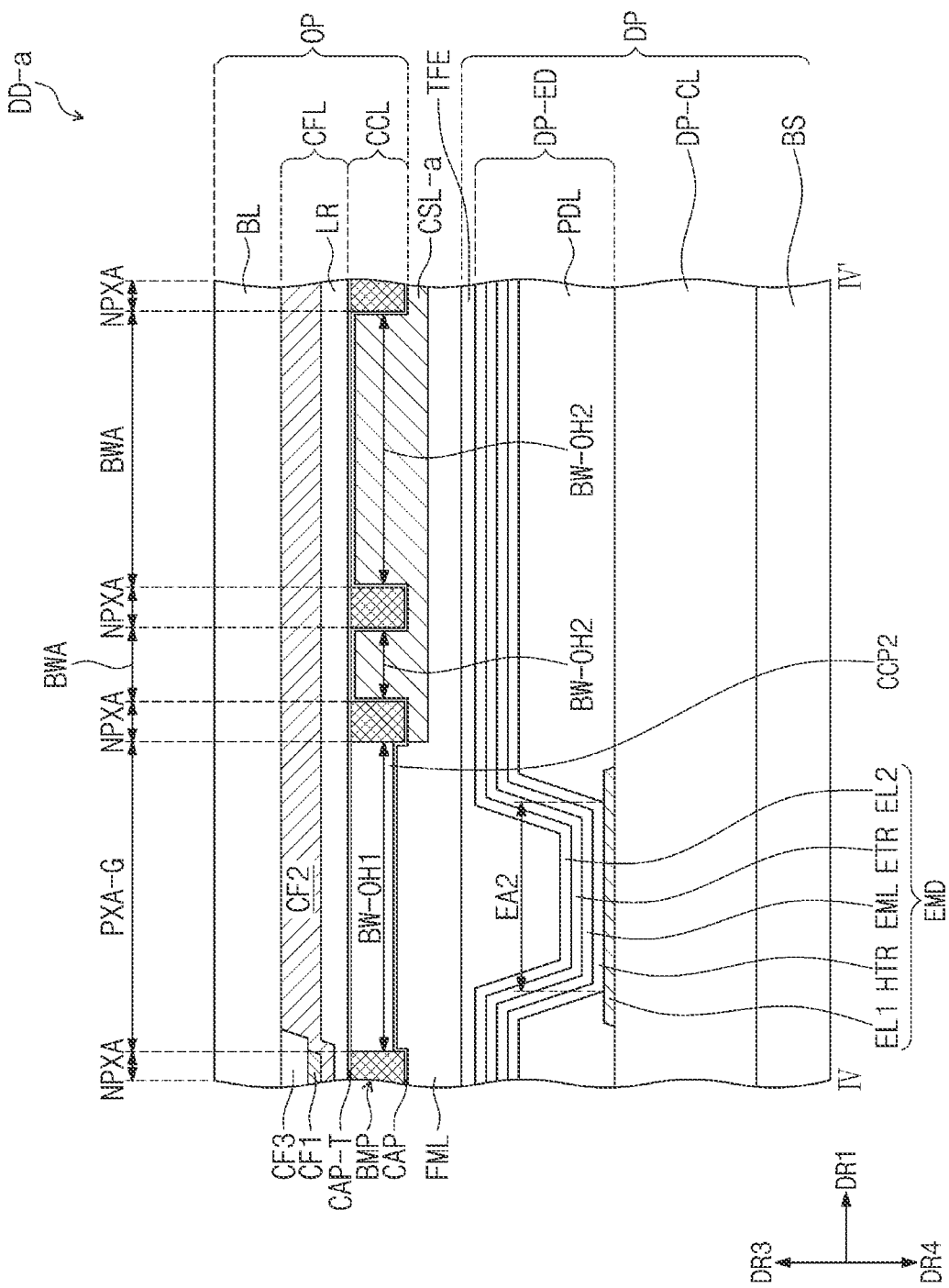
FIG. 10B is a schematic cross-sectional view illustrating a portion of the display device according to an embodiment.

FIG. 10A is a schematic plan view illustrating a portion of the display device according to an embodiment. FIG. 10B is a schematic cross-sectional view illustrating a portion of the display device according to an embodiment. FIG. 10B is a schematic cross-sectional view taken along line IV-IV' of FIG. 10A.

Referring to FIGS. 10A and 10B, a display device DD-a according to an embodiment may include pixel areas PXA-R, PXA-G, and PXA-B and bank well areas BWA. The display device DD-a according to an embodiment may include a protective layer CSL-a that overlaps a partition pattern BMP and a second opening BW-OH2. In the display device DD-a according to an embodiment, the protective layer CSL-a may be disposed to correspond to the bank well areas BWA and a peripheral area NPXA.

In an embodiment, the protective layer CSL-a may overlap the partition pattern BMP and the second opening BW-OH2 and may not overlap a first opening BW-OH1. The protective layer CSL-a may be filled into the second opening BW-OH2.

The display device DD-a according to an embodiment may include a filling layer FML disposed between an encapsulation layer TFE and a protective layer CSL-a. In an embodiment, the filling layer FML may be disposed to be filled between the encapsulation layer TFE and a light control layer CCL at a portion at which the protective layer CSL-a is not disposed. For example, a light control part CCP2 may be disposed in the first opening BW-OH1, and a remaining portion of the first opening BW-OH1 between the light control part CCP2 and the encapsulation layer TFE may be filled with the filling layer FML.

In the display device DD-a according to an embodiment, which may include the protective layer CSL-a filled into the second opening BW-OH2 and disposed to overlap the partition pattern BMP, a stepped portion of the second opening BW-OH2 may be covered by the protective layer CSL-a. Thus, in the display device DD-a according to an embodiment, the filling layer FML may be provided at a thickness or more to the bank well area BWA in addition to pixel areas PXA-R, PXA-G, and PXA-B. As the protective layer CSL-a is disposed to overlap the partition pattern BMP and the second opening BW-OH2, the display device DD-a according to an embodiment may have excellent display quality and durability characteristics by uniformly providing the filling layer FML between the upper panel OP and the lower panel DP.

In FIGS. 10A and 10B, a case in which the protective layer CSL-a is disposed to overlap a portion of the bank well area BWA and a portion of the peripheral area NPXA around the bank well area BWA is illustrated as an example. However, the embodiment is not limited thereto, and the protective layer CSL-a may be provided on the entire area except for the pixel areas PXA-R, PXA-G, and PXA-B.

Figure 11A:
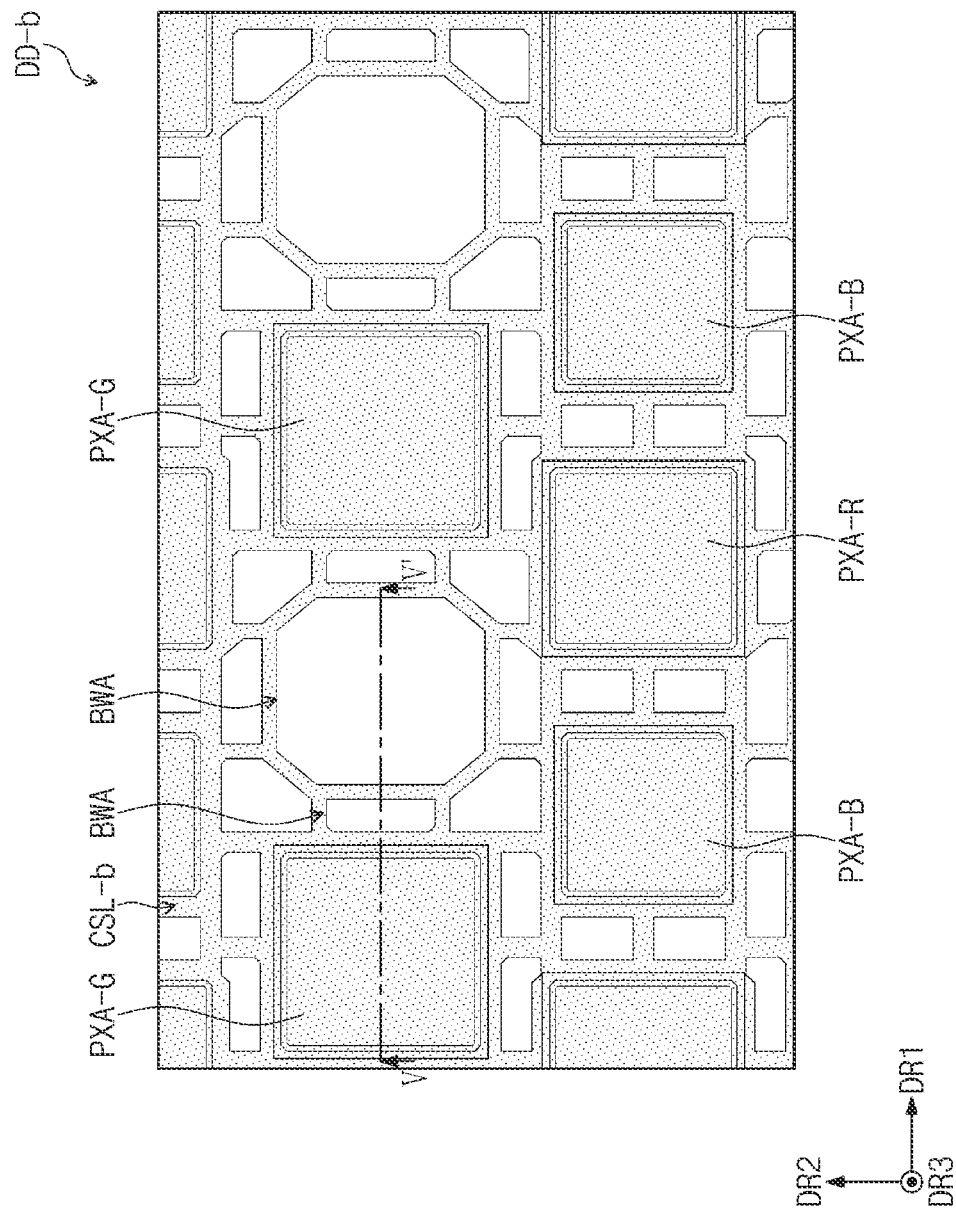
FIG. 11A is a schematic plan view illustrating a portion of the display device according to an embodiment.
Figure 11B:
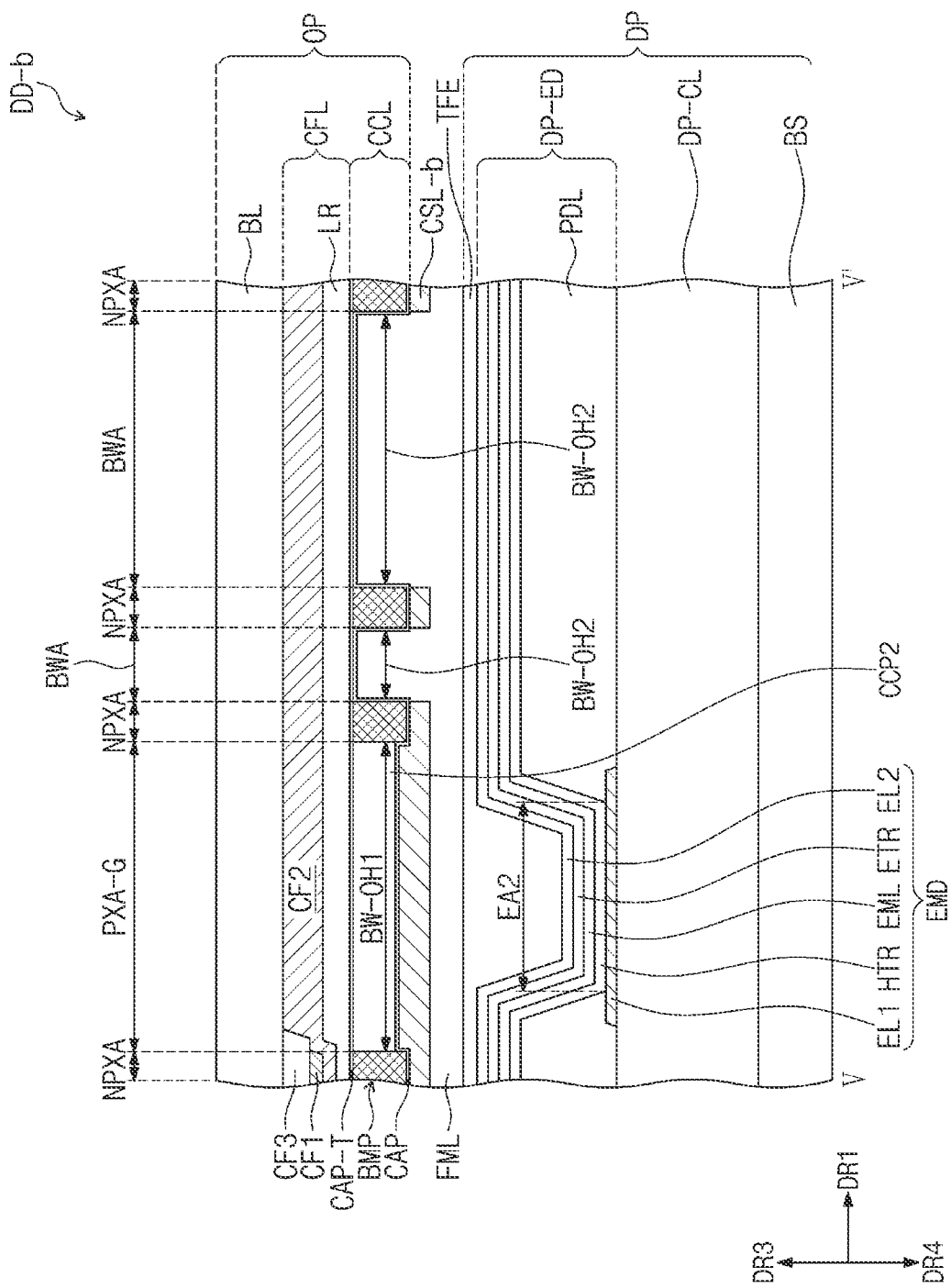
FIG. 11B is a schematic cross-sectional view illustrating a portion of the display device according to an embodiment.

FIG. 11A is a schematic plan view illustrating a portion of the display device according to an embodiment. FIG. 11B is a schematic cross-sectional view illustrating a portion of the display device according to an embodiment. FIG. 11B is a schematic cross-sectional view taken along line V-V' of FIG. 11A.

Referring to FIGS. 11A and 11B, a display device DD-b according to an embodiment may include pixel areas PXA-R, PXA-G, and PXA-B and bank well areas BWA. The display device DD-b according to an embodiment may include a protective layer CSL-b that overlaps a partition pattern BMP and a first opening BW-OH1.

In an embodiment, the protective layer CSL-b may overlap the partition pattern BMP and the first opening BW-OH1 and may not overlap a second opening BW-OH2. The protective layer CSL-b may be filled between a light control layer CCL and a filling layer FML in the first opening BW-OH1. For example, a light control part CCP2 may be disposed in the first opening BW-OH1, and a remaining portion of the first opening BW-OH1 between the light control part CCP2 and the encapsulation layer TFE may be filled with the protective layer CSL-b.

In the display device DD-b according to an embodiment, the filling layer FML, may be filled into the second opening BW-OH2 and may be disposed on an encapsulation layer TFE. The filling layer FML may be disposed to be filled into the second opening BW-OH2 and may be disposed to cover the protective layer CSL-b overlapping a light control part CCP2 and a partition pattern BMP.

In the display device DD-b according to an embodiment, the protective layer CSL-b may be disposed to overlap a light control part CCP2 so that the light control parts CCP1, CCP2, and CCP3 (see FIG. 3) are more safely protected from dents or cracks due to foreign substances. In the display device DD-b according to an embodiment, the protective layer CSL-b may be disposed on the partition pattern BMP to more readily maintain a spaced distance between the lower panel DP and the upper panel OP, thereby reducing dent defects due to foreign substances introduced in case that lower panel DP and the upper panel OP are bonded to each other. In the display device DD-b according to an embodiment, the filling layer FML may be filled in a state in which the second opening BW-OH2 corresponding to the bank well area BWA is not filled with the protective layer CSL-b. Thus, the foreign substances introduced by bonding the upper panel OP to the lower panel DP may not be disposed in a region, in which the light control parts CCP1, CCP2, and CCP3 are disposed, but be disposed in the second opening BW-OH2 to provide a foreign substance confinement effect.

In FIGS. 11A and 11B, a case in which the protective layer CSL-b is disposed to overlap the entire remaining regions except for the bank well area BWA is illustrated. However, the embodiment is not limited thereto, and the protective layer CSL-b may be provided to overlap only portions of the pixel areas PXA-R, PXA-G, and PXA-B and the partition pattern BMP around the pixel areas PXA-R, PXA-G, and PXA-B.

For example, the display device according to an embodiment may include the protective layer disposed to overlap at least one of the partition pattern, the pixel areas, and the bank well area to exhibit the improved durability characteristics. In an embodiment, in case that the protective layer overlaps the pixel areas, defects due to the dents of the foreign substances may be improved to confine the foreign substances introduced during the bonding process, thereby realizing excellent durability characteristics. In case that the protective layer according to an embodiment is disposed to overlap the bank well area, spreadability of the filling layer may be improved to exhibit excellent display quality and durability characteristics. In an embodiment, in case that the protective layer is provided to overlap the entirety of the partition pattern, the pixel areas, and the bank well area, the display device according to an embodiment may be improved in defect due to the dents of the foreign substances to improve the spreadability of the filling layer, thereby realizing the excellent display quality and the durability characteristics.

Figure 12A:
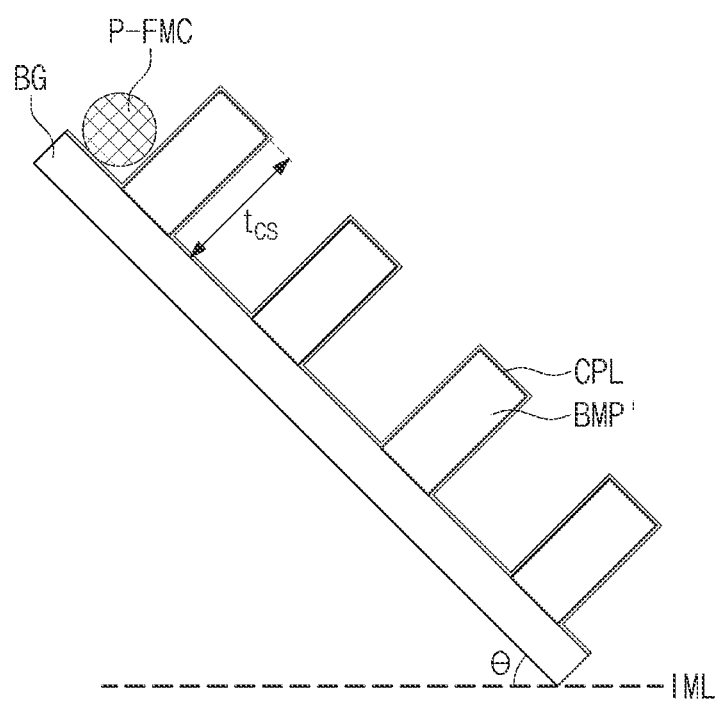
FIG. 12A is a view illustrating a simulation evaluation method for evaluating spreadability of a filling layer resin in a Comparative Example.
Figure 12B:
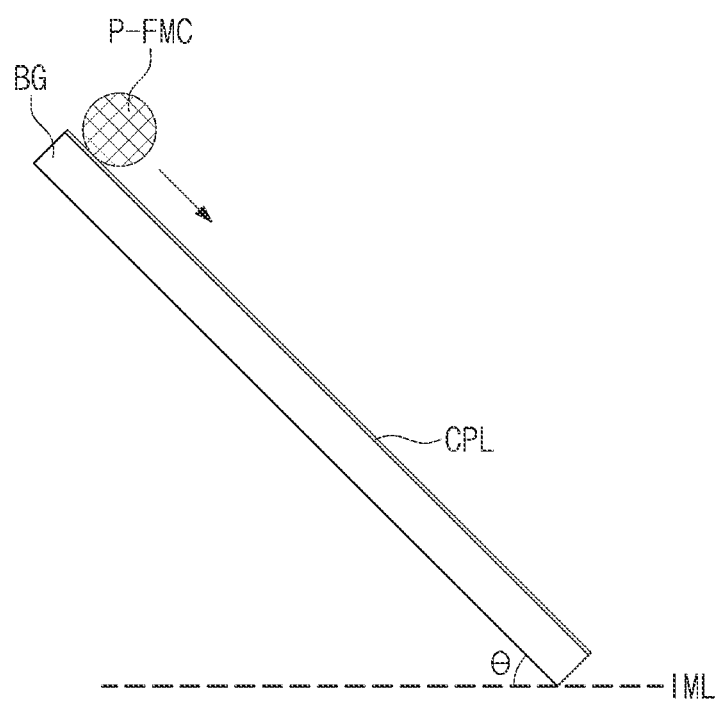
FIG. 12B is a view illustrating a simulation evaluation method for evaluating spreadability of a filling layer resin in an Embodiment.

FIGS. 12A and 12B are views illustrating a simulation evaluation method for evaluating spreadability of a filling layer resin. FIG. 12A is a view illustrating an example of a simulation evaluation method for spreadability of a filling layer resin in Comparative Example, and FIG. 12B is a view illustrating an example of a simulation evaluation method for spreadability of a filling layer resin in Embodiment.

The spreadability of the filling layer resin was evaluated by a degree of a flow of the filling layer resin in case that a test sample is tilted at an angle θ after the filling layer resin is provided on the test sample. In the test according to Comparative Example of FIG. 12A, a test sample, in which a protrusion BMP' corresponding to a partition wall is disposed on a glass substrate BG, which is a base substrate, and a barrier layer CPL covering the glass substrate BG and the protrusion BMP' is formed, was usedA thickness $t_{CS}$ of the protrusion BMP' was formed to be about 5 μm. The tilted angle θ of the test sample was about 30° with respect to a reference line IML. In the evaluation of the spreadability of the test sample according to Comparative Example, no flow of the filling layer resin P-FMC occurred.

In comparison, the test sample according to the Embodiment illustrated in FIG. 12B is different from the test sample according to Comparative Example in that the test sample according to the Embodiment does not include the protrusion BMP'. The test sample of FIG. 12B corresponds to a sample for simulating a case in which the protective layer is disposed so that a surface on which the filling layer resin is provided becomes a flat surface. The angle θ at which the test sample according to Embodiment is tilted was about 30° with respect to the reference line IML. In the evaluation of the spreadability of the test sample according to Embodiment, a flow of about 2 cm of the filling layer resin P-FMC along a top surface of the barrier layer CPL occurred.

Referring to the results of the simulation evaluation method of FIGS. 12A and 12B, in case that the flatness of the surface on which the filling layer resin is provided is improved, the spreadability of the filling layer resin may be improved, and accordingly, the filling layer may be uniformly provided on the entire display device to exhibit excellent durability characteristics.

Figure 13A:
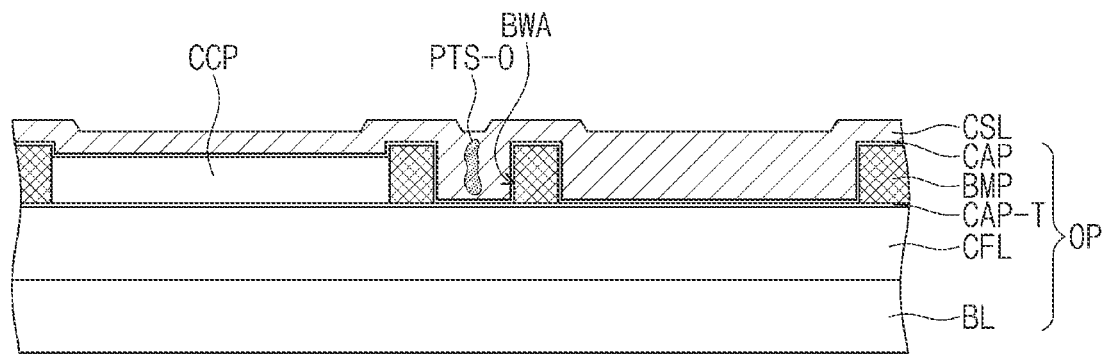
FIGS. 13A and 13B is each respectively view illustrating an effect of improving a foreign substance defect in the display device according to an embodiment.
Figure 13B:
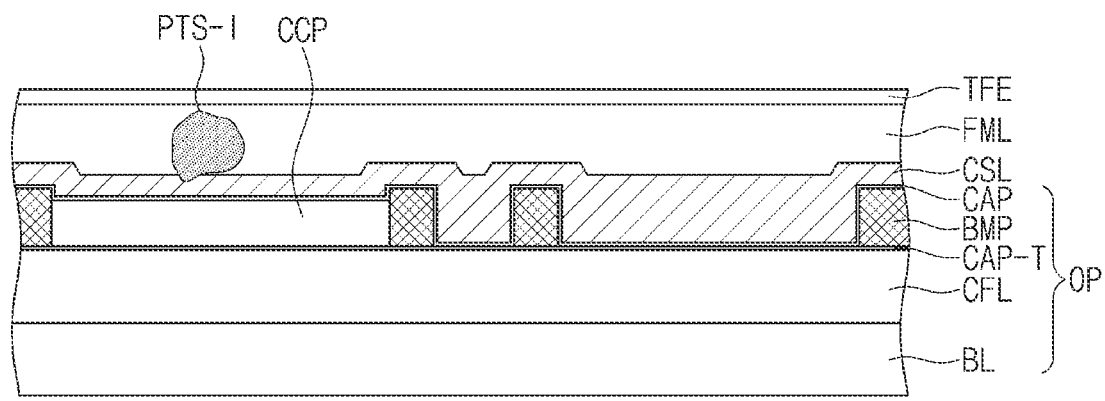

FIGS. 13A and 13B are views illustrating an effect of improving a foreign substance defect in the display device according to an embodiment.

FIG. 13A illustrates an example of a case in which a foreign substance PTS-O is introduced after an upper panel OP is manufactured and before a protective layer CSL is provided. Referring to FIG. 13A, even in case that the foreign substance PTS-O is introduced, a bank well area BWA may be defined, and in an embodiment in which the protective layer CSL is included, the external foreign substance PTS-O may be confined in a bank well area and may be sufficiently covered by the protective layer CSL to prevent defects due to the foreign substance PTS-O from occurring.

FIG. 13B illustrates an example of a case in which a foreign substance PTS-I is provided between an encapsulation layer TFE and an upper panel OP. Referring to FIG. 13B, even in case that the foreign substance PTS-I is introduced, a spaced distance between the upper panel OP and the encapsulation layer TFE may be maintained so that the upper panel OP and the encapsulation layer TFE are sufficiently covered by a protective layer CSL and a filling layer FML to prevent dent defects due to the foreign substance PTS-I introduced during the bonding from occurring.

Figure 14A:
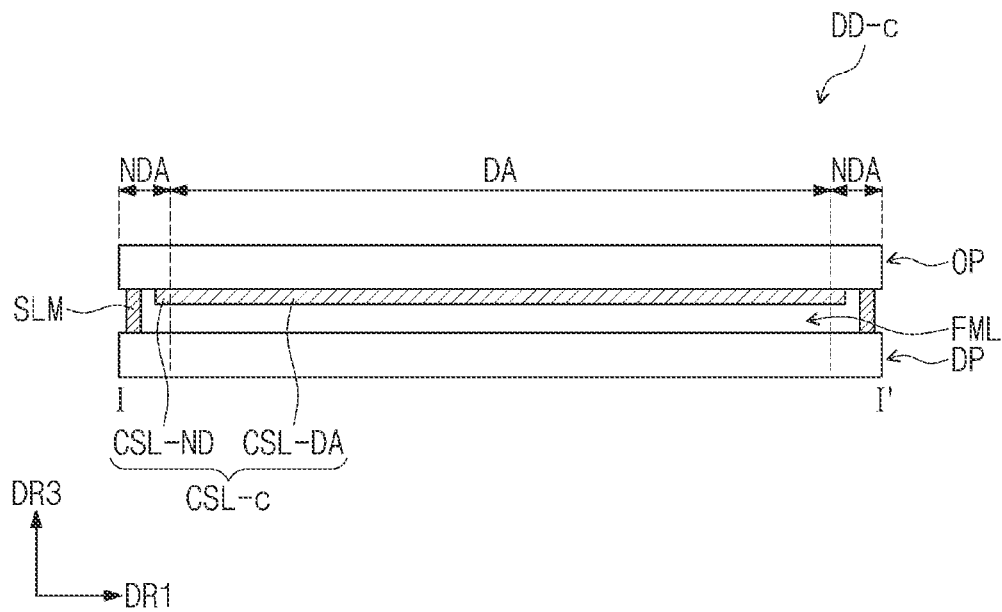
FIG. 14A is a schematic cross-sectional view illustrating a display device according to an embodiment corresponding to line I-I' of FIG. 1.
Figure 14B:
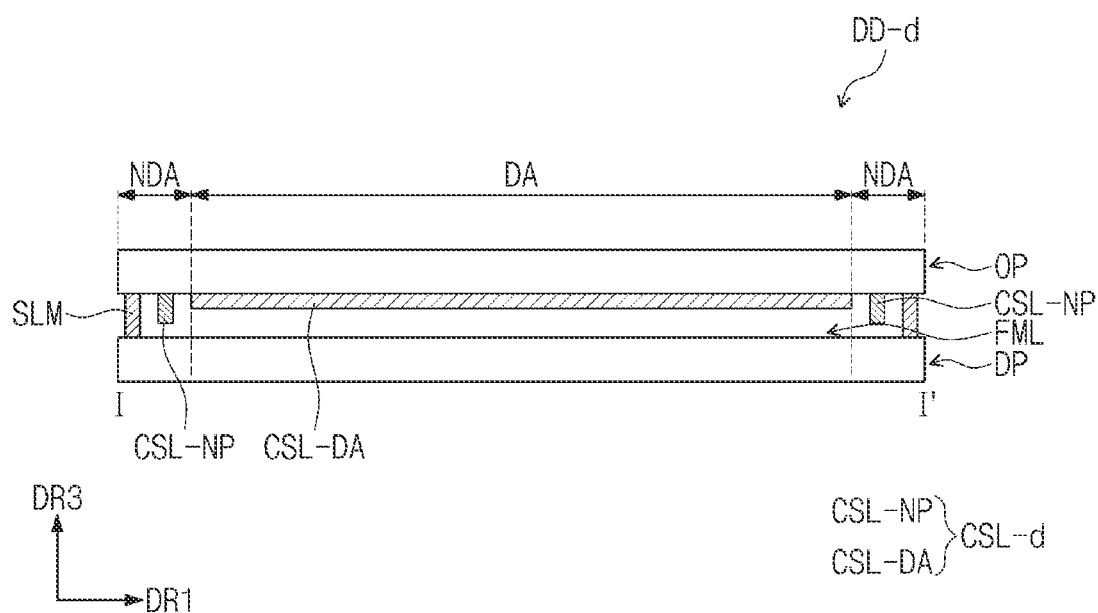
FIG. 14B is a schematic cross-sectional view of the display device according to an embodiment corresponding to line I-I' of FIG. 1.

FIGS. 14A and 14B are schematic cross-sectional views illustrating a display device according to an embodiment. FIGS. 14A and 14B are schematic cross-sectional views corresponding to line I-I' of FIG. 1.

Referring to FIGS. 14A and 14B, display devices DD-c and DD-d according to an embodiment may further include outer protective layers CSL-ND and CSL-NP overlapping a non-display area NDA.

Referring to FIG. 14A, the display device DD-c according to an embodiment may include a protective layer CSL-c disposed between a lower panel DP and an upper panel OP and a filling layer FML filled between the lower panel DP and the upper panel OP. In an embodiment, the protective layer CSL-c may include a main protective layer CSL-DA overlapping a display area DA and an outer protective layer CSL-ND overlapping a non-display area NDA. In an embodiment, the outer protective layer CSL-ND may extend from the main protective layer CSL-DA and may be integral with the main protective layer CSL-DA. The outer protective layer CSL-ND may reduce a stepped portion of the upper panel OP on the non-display area NDA to compensate a stepped portion of an outer portion between the lower panel DP and the upper panel OP in the display device DD.

Referring to FIG. 14B, the display device DD-d according to an embodiment may include a protective layer CSL-d disposed between a lower panel DP and an upper panel OP and a filling layer FML, filled between the lower panel DP and the upper panel OP. In an embodiment, the protective layer CSL-d may include a main protective layer CSL-DA overlapping a display area DA and an outer protective layer CSL-NP overlapping a non-display area NDA. Unlike the embodiment illustrated in FIG. 14A, in an embodiment illustrated in FIG. 14B, the outer protective layer CSL-NP may be provided to be spaced apart from the main protective layer CSL-DA. In an embodiment, the outer protective layer CSL-NP may reduce a stepped portion of the upper panel OP on the non-display area NDA to compensate a stepped portion of an outer portion between the lower panel DP and the upper panel OP in the display device DD. In an embodiment, a thickness of the outer protective layer CSL-NP may be greater than that of the main protective layer CSL-DA. However, the embodiment is not limited thereto, and the outer protective layer CSL-NP may be provided to have a same thickness as the main protective layer CSL-DA.

Figure 15A:
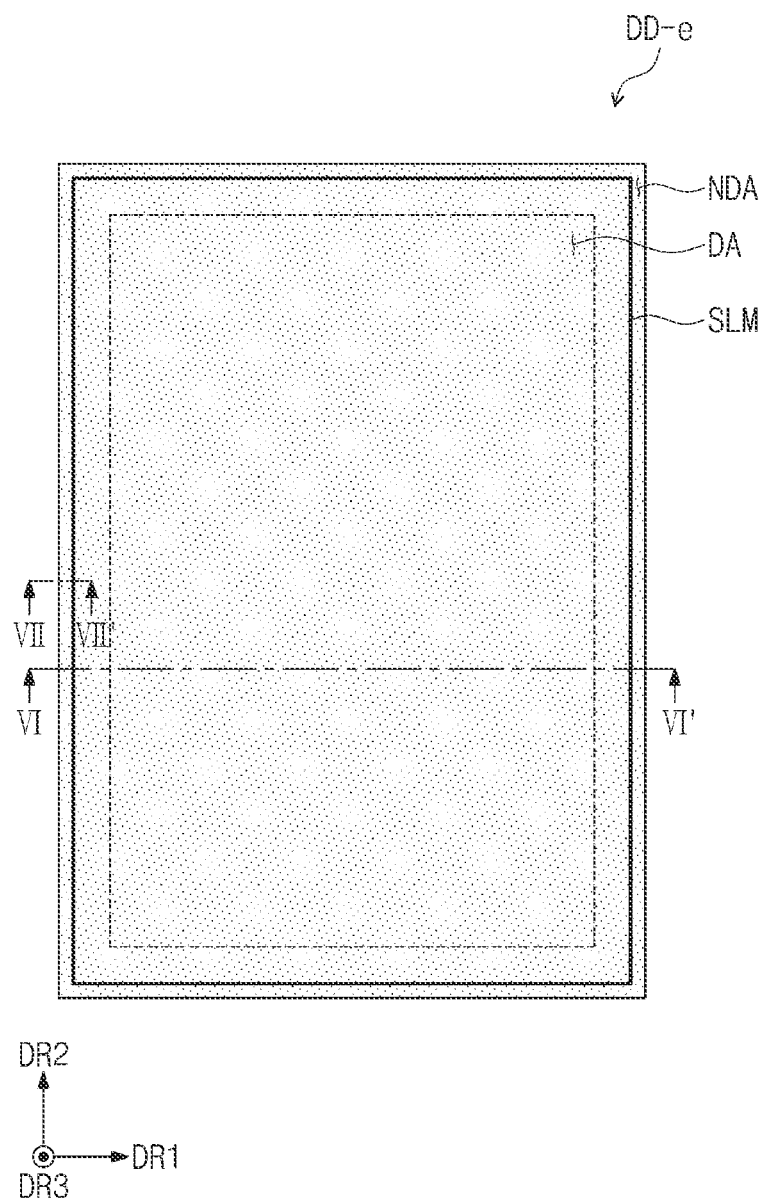
FIG. 15A is a schematic plan view of the display device according to an embodiment.
Figure 15B:
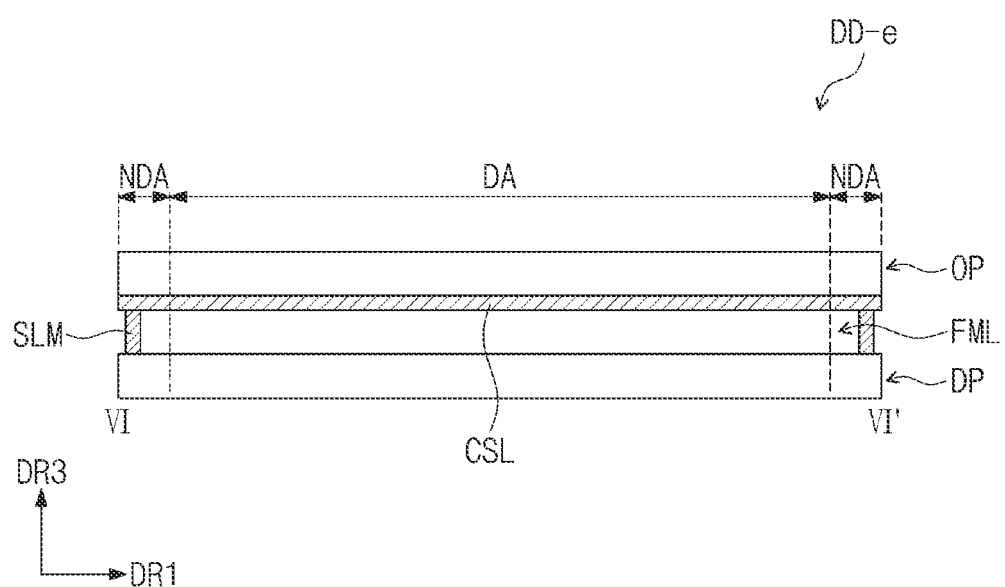
FIG. 15B is a schematic cross-sectional view illustrating the display device according to an embodiment corresponding to line VI-VI' of FIG. 15A.
Figure 15C:
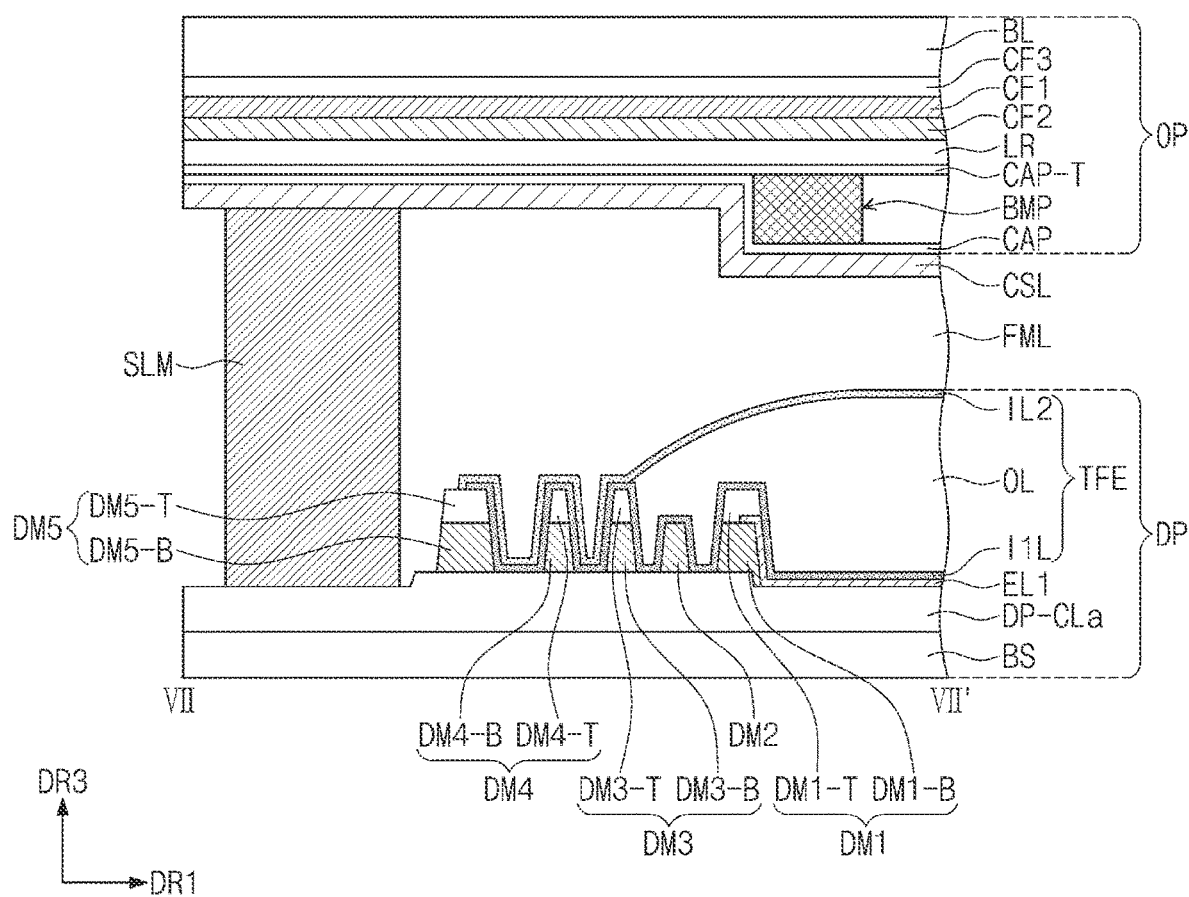
FIG. 15C is a schematic cross-sectional view illustrating a portion of the display device according to an embodiment corresponding to line VII-VII' of FIG. 15A.

FIG. 15A is a schematic plan view of the display device according to an embodiment, and FIG. 15B is a schematic cross-sectional view illustrating the display device according to an embodiment. FIG. 15C is a schematic cross-sectional view illustrating a portion of the display device according to an embodiment. FIG. 15B is a schematic cross-sectional view corresponding to line VI-VI' of FIG. 15A, and FIG. 15C is a schematic cross-sectional view corresponding to line VII-VII' of FIG. 15A. FIG. 15C is a schematic cross-sectional view illustrating a portion of a non-display area of the display device according to an embodiment.

A display device DD-e according to an embodiment illustrated in FIGS. 15A to 15C may include a protective layer CSL overlapping both a display area DA and a non-display area NDA. The protective layer CSL may be disposed on an entire bottom surface of an upper panel OP. For example, in an embodiment, the protective layer CSL may be provided as a single layer overlapping both the display area DA and the non-display area NDA and may be disposed on a sealing part SLM on the non-display area NDA. In the display device DD-e according to an embodiment, a filling layer FML may be disposed at a portion surrounded by components of the protective layer CSL, the sealing part SLM, and the lower panel DP.

The protective layer CSL disposed to correspond to both the display area DA and the non-display area NDA may cover one surface or a surface of the upper panel OP to compensate a stepped portion between the upper panel OP and the lower panel DP. Thus, deterioration of durability due to the introduction of foreign substances may be improved. The display device DD-e according to an embodiment may include the protective layer CSL provided as one layer or layer by extending up to the sealing part SLM, and thus, an interval between the upper panel OP and the lower panel DP may be maintained even in case that there is no configuration of a separate column spacer.

Referring to FIG. 15C, the upper panel OP may include a base substrate BL, filters CF3, CF1, and CF2 sequentially disposed under or below the base substrate BL, a low refractive index layer LR, a second barrier layer CAP-T, a partition pattern BMP, and a first barrier layer CAP at a portion corresponding to the non-display area NDA (see FIG. 15B). In an embodiment illustrated in FIG. 15C, a structure, in which the third filter CF3, the first filter CF1, and the second filter CF2 are sequentially laminated under or below the base substrate BL, is disclosed. However, the embodiment is not limited thereto, and the laminated order of the filters may be changed.

The lower panel DP may include a base layer BS, a lower circuit layer DP-CLa, dam parts DM1 to DM5, a first electrode EL1, and an encapsulation layer TFE, which are sequentially laminated, at a portion corresponding to the non-display area NDA (see FIG. 15B). In FIG. 15C, the lower circuit layer DP-Cla may refer to remaining portions of the circuit layer DP-CL (FIG. 4) excluding the dam parts DM1 to DM5. For example, the lower circuit layer DP-Cla may include an insulating layer, a semiconductor pattern, a conductive pattern, and a signal line.

Although FIG. 15C illustrates an embodiment in which five dam parts, for example, first to fifth dam parts DM1 to DM5 are disposed, the embodiment is not limited thereto, and the number of dam parts may be changed. For example, the number of dam parts may be about 2 more and about 4 or less, or about 6 or more.

The dam parts DM1 to DM5 may be spaced apart from each other in a direction of a first directional axis DR1. At least one of the dam parts DM1 to DM5 may have a laminated structure. In the embodiment illustrated in FIG. 15C, the first dam part DM1, the third dam part DM3, the fourth dam part DM4, and the fifth dam part DM5 may include lower protrusions DM1-B, DM3-B, DM4-B, and DM5-B and upper protrusions DM1-T, DM3-T, DM4-T, and DM5-T, respectively.

In an embodiment, the lower protrusions DM1-B, DM3-B, DM4-B, and DM5-B may be formed through a same process as a portion of the insulating layers included in the lower circuit layer DP-Cla. For example, each of the lower protrusions DM1-B, DM3-B, DM4-B, and DM5-B may include an organic material. Also, in an embodiment, each of the upper protrusions DM1-T, DM3-T, DM4-T, and DM5-T may be a layer formed through a same process as the pixel defining layer PDL.

The second dam portion DM2 may be a layer formed through a same process as the lower protrusions DM1-B, DM3-B, DM4-B, and DM5-B. However, the embodiment is not limited thereto.

Some or a number of the dam parts DM1 to DM5 overlap all of a first inorganic layer ILL an organic layer OL, and a second inorganic layer IL2 of the encapsulation layer TFE, and some or a number of the dam parts may overlap only the first inorganic layer IL1 and the second inorganic layer IL2. The display device according to an embodiment may include the lower panel including the display element layer, the upper panel including the partition pattern and the light control part disposed in the opening defined in the partition pattern, the protective layer disposed between the upper panel and the lower panel, and the filling layer disposed between the protective layer and the lower panel to maintain the spaced distance between upper panel and the lower panel even if there is no configuration of the separate column spacer and to be sufficiently covered by the protective layer and the filling layer even in case that the foreign substances are introduced, thereby improving the durability.

The display device according to an embodiment may include the protective layer, which is distinguished from the filling layer, between the lower panel including the display element and the upper panel including the light control layer to improve the reliability and the display quality.

It will be apparent to those skilled in the art that various modifications and deviations can be made in the disclosure. Thus, it is intended that the disclosure covers the modifications and deviations within the spirit and scope of the disclosure and the appended claims and their equivalents.

Accordingly, the technical scope of the disclosure should not be limited to the contents described in the detailed description of the specification, but should also be determined by the claims.

What is claimed is:

1. A display device comprising:
    a lower panel comprising a display element layer and an encapsulation layer disposed on the display element layer;
    an upper panel comprising a partition pattern including a first opening and a second opening, and a light control layer comprising a light control part disposed in the first opening;
    a protective layer disposed between the upper panel and the lower panel, the protective layer overlaps at least one of the first opening or the second opening and the partition pattern in a plan view, and the protective layer has varying non-zero thickness in a thickness direction of the display device depending on location; and
    a filling layer disposed between the protective layer and the lower panel.

2. The display device of claim 1, wherein
    the filling layer is directly disposed on the encapsulation layer,
    the protective layer is directly disposed on the filling layer, and
    the protective layer reduces a step difference between the partition pattern and at least one of the first opening and the second opening.

3. The display device of claim 1, wherein the protective layer is filled into the first opening and the second opening of the partition pattern.

4. The display device of claim 1, wherein
    the protective layer is a single layer that covers the partition pattern and the light control layer, and
    an area of the second opening in a plan view is about equal to an area of the first opening in a plan view.

5. The display device of claim 1, wherein
    the second opening does not comprise the light control part, the protective layer overlaps the partition pattern and the second opening in the plan view, and the protective layer does not overlap the first opening in the plan view, and the protective layer fills the second opening of the partition pattern.

6. The display device of claim 5, wherein the first opening is filled with the filling layer.

7. The display device of claim 1, wherein the protective layer overlaps the partition pattern and the first opening in the plan view and does not overlap the second opening in the plan view, and the protective layer is filled between the light control layer and the filling layer in the first opening of the partition pattern.

8. The display device of claim 7, wherein the second opening does not comprise the light control part, and the second opening is filled with the filling layer.

9. The display device of claim 1, wherein the protective layer is made of a protective layer resin comprising an acrylic-based resin or an epoxy-based resin, and a thickness of the protective layer at a location corresponding to the second opening is greater than a thickness of the protective layer at a location corresponding to the partition pattern.

10. The display device of claim 1, wherein the light control layer comprises:

a barrier layer disposed on at least one of an upper portion and a lower portion of the light control part.

11. The display device of claim 10, wherein the barrier layer comprises a first barrier layer adjacent to the protective layer and a second barrier layer spaced apart from the protective layer with the light control part disposed between the first barrier layer and the second barrier layer, and the first barrier layer covers a stepped portion between the partition pattern and the light control part.

12. The display device of claim 1, wherein the display element layer comprises:

a pixel defining layer including an emission opening; and a light emitting element comprising a first electrode including a top surface exposed through the emission opening, a second electrode that faces the first electrode, and a light emitting layer disposed between the first electrode and the second electrode, and the emission opening overlaps the first opening in the plan view.

13. The display device of claim 1, wherein the display element layer comprises a light emitting element that emits blue light, and the light control layer comprises:

a first light control part comprising a first quantum dot that converts the blue light into red light;

a second light control part comprising a second quantum dot that converts the blue light into green light; and a third light control part that transmits the blue light.

14. The display device of claim 13, wherein the upper panel comprises a color filter layer disposed on the light control layer and a base substrate disposed on the color filter layer.

15. The display device of claim 14, wherein the color filter layer comprises:

a first filter that transmits the red light and is disposed on the first light control part;

a second filter that transmits the green light and is disposed on the second light control part; and a third filter that transmits the blue light.

16. A display device comprising:

a display area and a non-display area adjacent to the display area;

a lower panel comprising a display element layer including an emission area;

an upper panel disposed on the lower panel and comprising a partition pattern, the partition pattern includes a first opening overlapping the emission area in a plan view and a second opening not overlapping the emission area in the plan view, and a light control layer comprising a light control part disposed in the first opening;

a protective layer disposed between the upper panel and the lower panel, and the protective layer overlaps the display area in the plan view; and a filling layer disposed between the protective layer and the lower panel, wherein the protective layer overlaps at least one of the first opening and the second opening and the partition pattern in the plan view, and a thickness of the protective layer at a location corresponding to at least one of first opening and the second opening is greater than a thickness of the protective layer at a location corresponding to the partition pattern.

17. The display device of claim 16, wherein the protective layer is a single layer that covers a curved portion of a surface of the upper panel facing the lower panel.

18. The display device of claim 16, wherein the protective layer overlaps the partition pattern and the second opening in the plan view and does not overlap the first opening in the plan view, and the first opening is filled with the filling layer, and the second opening is filled with the protective layer.

19. The display device of claim 16, wherein the protective layer overlaps the partition pattern and the first opening in the plan view and does not overlap the second opening in the plan view, and the protective layer is filled between the light control layer and the filling layer in the first opening of the partition pattern.

20. The display device of claim 16, wherein the protective layer comprises an outer protective layer overlapping the non-display area in the plan view.

21. A display device comprising:

a lower panel comprising an emission area divided by a pixel defining layer;

an upper panel disposed on the lower panel and divided into a pixel area and a bank well area divided by a partition pattern;

a protective layer disposed between the lower panel and the upper panel, the protective layer covers a surface of the upper panel facing the lower panel, the protective layer reduces a height difference between the pixel area and the bank well area; and a filling layer disposed between the lower panel and the protective layer, and the filling layer and the protective layer comprise a different material.

22. The display device of claim 21, wherein the pixel area overlaps the emission area in a plan view, and the bank well area does not overlap the emission area in the plan area.

23. The display device of claim 21, wherein
the protective layer covers a stepped portion between the pixel area and the bank well area, and
a height difference on a surface of the protective layer between the partition pattern and the bank well area is less than a thickness of the partition pattern.

24. The display device of claim 21, wherein the lower panel comprises:
a base layer, a circuit layer disposed on the base layer, a display element layer disposed on the circuit layer, and an encapsulation layer disposed on the display element layer, and
the upper panel comprises a base substrate, a color filter layer disposed below the base substrate, and a light control layer disposed below the color filter layer.

25. The display device of claim 24, wherein
the filling layer is directly disposed on the encapsulation layer, and
the protective layer is disposed between the filling layer and the light control layer.

26. The display device of claim 21, wherein
the display device is divided into a display area and a non-display area adjacent to the display area,
the display device comprises a sealing part disposed between the lower panel and the upper panel corresponding to the non-display area, and
the protective layer is disposed between the sealing part and the upper panel in the non-display area.

27. The display device of claim 26, wherein the protective layer is a single layer overlapping the display area and the non-display area in the plan view.

* * * * *